(12) United States Patent
Hasegawa et al.

(10) Patent No.: US 8,287,749 B2
(45) Date of Patent: Oct. 16, 2012

(54) HIGH-MOLECULAR THIN FILM, PATTERN MEDIUM AND MANUFACTURING METHOD THEREOF

(75) Inventors: Hirokazu Hasegawa, Kyoto (JP); Mikihito Takenaka, Kyoto (JP); Hiroshi Yoshida, Mito (JP); Yasuhiko Tada, Tokai (JP)

(73) Assignee: Hitachi, Ltd., Tokyo (JP)

( * ) Notice: Subject to any disclaimer, the term of this patent is extended or adjusted under 35 U.S.C. 154(b) by 402 days.

(21) Appl. No.: 12/644,208

(22) Filed: Dec. 22, 2009

(65) Prior Publication Data
US 2010/0159214 A1 Jun. 24, 2010

(30) Foreign Application Priority Data
Dec. 22, 2008 (JP) ................................ 2008-325407

(51) Int. Cl.
*B81C 1/00* (2006.01)
*B82Y 40/00* (2011.01)

(52) U.S. Cl. ............ 216/41; 216/49; 427/271; 977/888; 977/890

(58) Field of Classification Search .................. None
See application file for complete search history.

(56) References Cited

U.S. PATENT DOCUMENTS

| 6,746,825 B2 | 6/2004 | Nealey et al. | |
|---|---|---|---|
| 6,926,953 B2 | 8/2005 | Nealey et al. | |
| 7,767,265 B2* | 8/2010 | Yoshida et al. | 427/374.1 |
| 8,039,056 B2* | 10/2011 | Hasegawa et al. | 427/264 |
| 2005/0215723 A1* | 9/2005 | Knoll et al. | 525/314 |
| 2011/0146095 A1* | 6/2011 | Tanida et al. | 33/555.1 |
| 2011/0281085 A1* | 11/2011 | Tada et al. | 428/195.1 |

FOREIGN PATENT DOCUMENTS

| JP | 2007-138052 | 6/2007 |
|---|---|---|
| JP | 2007-313568 | 12/2007 |
| JP | 2008-231233 | 10/2008 |

* cited by examiner

*Primary Examiner* — Anita Alanko
(74) *Attorney, Agent, or Firm* — Antonelli, Terry, Stout & Kraus, LLP.

(57) ABSTRACT

The present invention provides a method of manufacturing a high-molecular thin film having a fine structure from a block-copolymer compound containing a block copolymer A as a main constituent composed of at least a block chain A1 and a block chain A2, and a block copolymer B as an accessory constituent composed of a block chain B1 miscible with a polymeric phase P1 mainly composed of the block chain A1 and a block chain B2 miscible with a polymeric phase P2 mainly composed of the block chain A2, and a substrate having a surface on which the block-copolymer compound is applied and on which a pattern member formed of a second material is discretely arranged to a surface part formed of a first material.

10 Claims, 14 Drawing Sheets

FIG.6A (a-1)
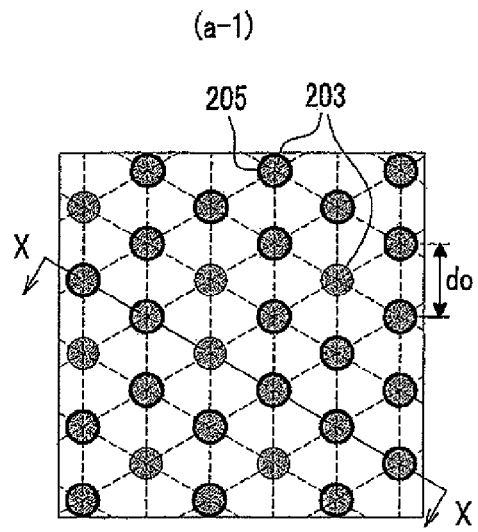
FIG.6B (a-2)
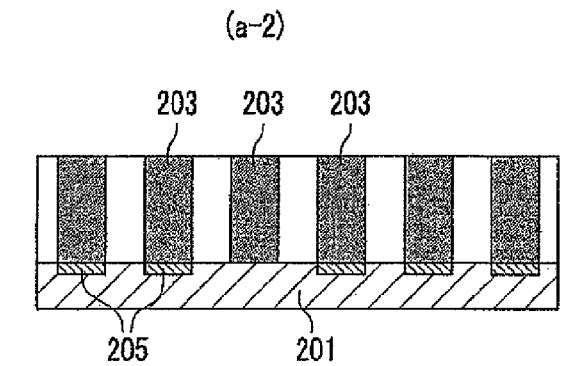
FIG.6C (b-1)
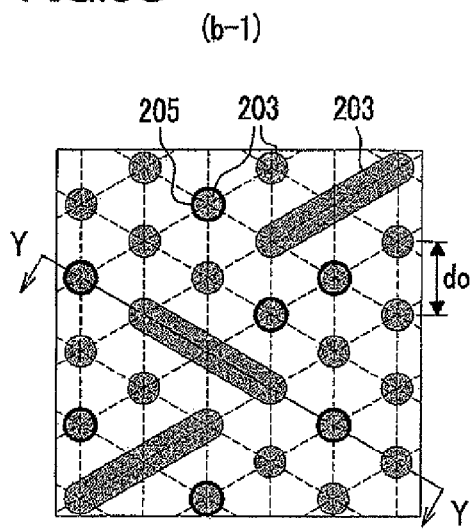
FIG.6D (b-2)
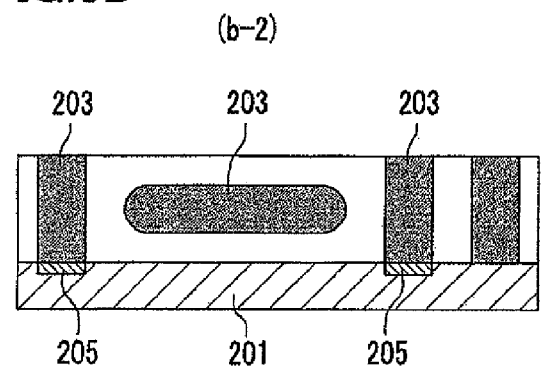

DEFECT RATE 0%

DEFECT RATE 50%

DEFECT RATE 25%

DEFECT RATE 75%

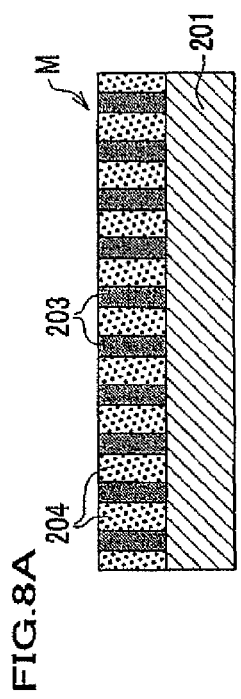
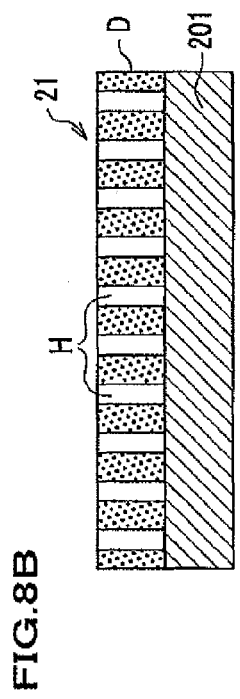
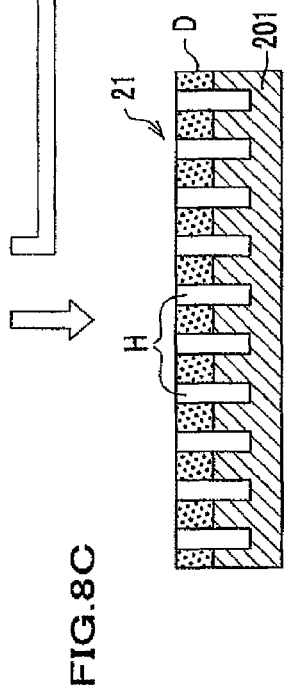
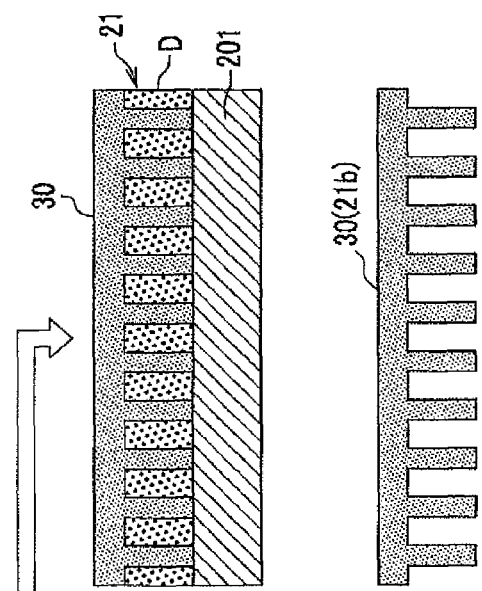
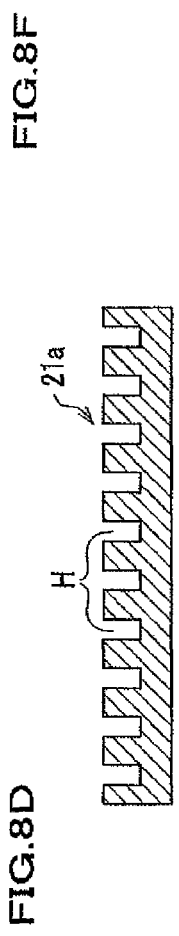

(b-1)

(b-2)

(a-1)

(a-2)

HIGH-MOLECULAR THIN FILM, PATTERN MEDIUM AND MANUFACTURING METHOD THEREOF

BACKGROUND OF THE INVENTION

1. Field of the Invention

The present invention relates to a high-molecular thin film having a fine structure obtained by microphase separation of block copolymers on a substrate surface, a pattern medium obtained by utilizing the high-molecular thin film, and a manufacturing method of those.

2. Description of the Related Art

In recent days, a formation of a fine ordered array pattern with a size of several nm to several hundred nm on a substrate becomes highly requisite together with downsizing of electronic devices, energy storage devices, sensors and the like and with advancement of the performances thereof. Accordingly, processes of manufacturing such a fine pattern structure with high precision and low cost must be established.

A general example of a method of fabricating such a fine pattern is a top-down method represented by lithography, i.e., a method of chipping a bulk material minutely to form a shape. For example, photolithography applied in semiconductor microfabrication for manufacturing of an LSI or the like is a representative example.

However, as the level of fineness increases, an application of such a top-down method gives difficulties relating to both apparatus and process. In particular, as the fabrication size of a fine pattern becomes so fine in several ten rim, electron beams and deep ultraviolet become requisite, resulting in huge investment for apparatuses. Also, as formation of a fine pattern using a mask becomes difficult, direct plotting must be applied, so that it becomes difficult to avoid a problem that the fabrication throughput significantly decreases.

Getting attention under such circumstances is a process utilizing a phenomenon that substances naturally form a structure, i.e., a so-called self-assembly phenomenon. In particular, a process utilizing the self-assembly phenomenon of block copolymers, i.e., a so-called microphase separation is superior from the standpoint of its capability of formation of a fine regular structure having various kinds of shapes in several ten nm to several hundred nm by a simple application process. For example, when various kinds of high-molecular segments constituting block copolymers do not mix one another (immiscible), a fine structure having a specific regularity is self-assembled by phase separation (microphase separation) of those high-molecular segments.

An example of formation of such a fine regular structure by utilizing a self-assembly phenomenon is a conventionally well-known technology of using a block copolymer thin film, composed of combinations of polystyrene and polybutadiene, polystyrene and polyisoprene, polystyrene and polymethylmethacrylate, and the like, as an etching mask, and of forming structures, such as a pore, and a line-and-space, on a substrate.

According to such microphase separation phenomenon of block copolymers, it is possible to obtain a high-molecular thin film having a structure in which fine spherical, cylindrical, and lamella microdomains that are difficult to obtain by the top-down method are arranged regularly.

In general, application of a self-assembly phenomenon including microphase separation to patterning has, however, following problem.

Patterning utilizing a self-assembly phenomenon has a superior short-range regularity but has a poor long-range orderliness, so that defects and grain boundaries are present and formation of an arbitrary pattern is difficult. In particular, because self-assembling utilizes a structure formed by nature, i.e., a structure that has smallest energy, it is generally difficult to obtain structures other than a regular structure with a period inherent to a material, and because of such restriction, the range of application of patterning is thus limited. In order to overcome such defects, the following two methods are conventionally known.

A first method causes microphase separation to be developed by forming a trench on a substrate surface and by forming block copolymers in the trench. According to such a method, a fine structure developed by the microphase separation is arranged along a wall surface of the trench, so that it becomes possible to control the directionality of the regular structure in one direction, thereby enhancing the long-range orderliness. Also, any generation of defects is suppressed because the regular structure is filled along the wall surface. Such an effect is known as a graphoepitaxy effect. The wider the width of the trench, the less such an effect. When the width of the trench becomes ten times or so as much as the period of the regular structure, disorder is produced in the regular structure at the center of the trench. Also, formation of the trench on the substrate surface is requisite, so that such a method cannot be applied to a case in which a flat surface is necessary. Further, according to such a method, it is possible to orient the regular structure in a direction along the trench, but further arbitrary pattern controlling is not possible.

A second method causes a substrate surface to be chemically patterned, and controls a structure developed by microphase separation due to chemical interaction between the substrate surface and block copolymers (see, for example, U.S. Pat. Nos. 6,746,825 and 6,926,953). FIG. 14 is a conceptual perspective view for explaining a conventional method of causing a substrate surface to be chemically patterned.

As shown in FIG. 14, this method uses a chemically-patterned substrate 305 having a surface thereof patterned by a top-down method in such a way that affinities to each block chain (first polymer block chain 301 and second polymer block chain 302) constituting a block copolymer 303 differ from each other. According to this method, a film of the block copolymer 303 is formed on a surface of the chemically-patterned substrate 305 to develop microphase separation. For example, when a diblock copolymer composed of polystyrene and polymethylmethacrylate is used as the block copolymer 303, a chemical pattern is formed while the surface of the chemically-patterned substrate 305 is divided into an area 307 having a good affinity to polystyrene and an area 308 having a good affinity to polymethylmethacrylate. As the shape of the chemical pattern is conformed to a microphase-separated structure of a polystyrene/polymethylmethacrylate diblock copolymer, a continuous phase 306 formed of polystyrene is arranged on the area 307 having good affinity to polystyrene and a cylindrical microdomain 304 formed of polymethylmethacrylate is arranged on the area 308 having good affinity to polymethylmethacrylate at the time of microphase separation.

That is, according to this method, it is possible to arrange a microphase-separated structure along marks chemically arranged on the substrate surface. Also, according to this method, because the chemical pattern is formed by the top-down method, the long-range orderliness of the pattern obtained is secured by the top-down method, and it is possible to obtain a pattern having good regularity and few defects across a wide range. In the following explanation, this method is called a chemical registration technique of a microdomain in some cases.

According to the conventional chemical registration technique, however, when a process size becomes fine and highly density until several ten nm, any defects and disorder of a pattern shape tend to be produced. This negatively affects a microphase-separated structure to be obtained. Accordingly, it is thought that obtained chemical patterns are arranged discretely relative to locations where microdomains are to be formed, i.e., a microphase-separated structure is formed in such a way that a microdomain is also formed between chemically arranged marks by an interpolation effect of self-assembling.

However, when a ratio between a density of the microdomains and a density of patterns has a relation like n:1 (where n is a number greater than 1), there is a following problem.

That is, when microphase separation of a block copolymer film formed on a substrate surface is developed, a part where a chemical pattern is formed becomes a structure having microdomains upright relative to the substrate, but a part where no chemical pattern is formed has microdomains oriented not upstanding relative to the substrate, so that a high-density pattern having chemical patterns interpolated may not be obtained in some cases. Accordingly, it is difficult to obtain a pattern which does not lose uniform long-range orderliness across the whole area of the chemical pattern and has few defects. In addition, the larger the value of n, the more remarkable this problem.

Therefore, an object of the present invention is to provide a high-molecular thin film having a fine structure composed of a microphase-separated structure with a good long-range orderliness and few defects, a pattern medium obtained by utilizing such a high-molecular thin film, and a method of manufacturing those.

SUMMARY OF THE INVENTION

In order to achieve the above object, the present invention provides a method of manufacturing a high-molecular thin film having a fine structure, the method including:

a first step of arranging a high-molecular layer on a substrate surface, the high-molecular layer containing a block-polymer compound; and a second step of causing microphase separation of the high-molecular layer and of forming microdomains arranged in a continuous phase regularly, and in which the block-copolymer compound containing:

a block copolymer A as a main constituent, the block copolymer A being composed of at least a polymer block chain A1 and a polymer block chain A2; and a block copolymer B as an accessory constituent, the block copolymer B being composed of a polymer block chain B1 and a polymer block chain B2, the polymer block chain B1 being miscible with a polymeric phase P1 mainly composed of the polymer block chain A1, and the polymer block chain B2 being miscible with a polymeric phase P2 mainly composed of the polymer block chain A2, a molecular weight Mn (A1) of the polymer block chain A1, a molecular weight Mn (A2) of the polymer block chain A2, and a molecular weight Mn (B2) of the polymer block chain B2 satisfy a following relational expression (1), the substrate surface has a surface part formed of a first material and a surface part on which a pattern member formed of a second material is arranged discretely to the surface part, and in the second step, interfacial tension of the polymeric phase P1 to the surface part formed of the first material is smaller than interfacial tension to the surface part formed of the second material, and interfacial tension of the polymeric phase P2 to the surface part formed of the first material is larger than interfacial tension to the surface part formed of the second material.

$$Mn(A2) > Mn(A1) \text{ and } Mn(B2) > Mn(A2) \quad \text{Relational expression (1):}$$

Also, in order to achieve the above object, the present invention provides a method of manufacturing a pattern medium, the method including:

a step of eliminating either a continuous phase of a high-molecular thin film or microdomains thereof, the high-molecular thin film being obtained on a substrate by the above manufacturing method.

Also, in order to achieve the above object, the present invention provides a fine structure including a high-molecular thin film formed by the above manufacturing method.

Also, in order to achieve the above object, the present invention provides a pattern medium formed by the above pattern-medium manufacturing method.

Also, in order to achieve the above object, the present invention provides a pattern medium replicated by transferring a pattern arrangement from a the above pattern medium as a master mold.

According to the present invention, there are provided a high-molecular thin film having a fine structure composed of a microphase-separated structure with good long-range orderliness and few defects, a pattern medium obtained by utilizing such a high-molecular thin film, and a method of manufacturing those.

BRIEF DESCRIPTION OF THE DRAWINGS

FIG. 6A (a-1) is a conceptual diagram showing how a defect of chemical mark is interpolated using the block-polymer compound of the embodiment;

FIG. 6B (a-2) is a cross-sectional view along a line X-X in FIG. 6A (a-1);

FIG. 6C (b-1) is a conceptual diagram showing a condition that a defect of chemical mark is not interpolated even though a block copolymer of a comparative example is used;

FIG. 6D (b-2) is a cross-sectional view along a line Y-Y in FIG. 6C (b-1);

FIGS. 8A to 8F are process drawings for explaining a manufacturing method of a pattern medium using the high-molecular thin film having the fine structure according to the embodiment;

DETAILED DESCRIPTION OF THE EMBODIMENT

An explanation will be given of an embodiment of the present invention with reference to the accompanying drawings.

First, a method of manufacturing a high-molecular thin film having a fine structure will be explained. Note that an explanation will be given of a manufacturing method (manufacturing method by a chemical registration technique) of a high-molecular thin film having a structure in which a microdomain comprised of a cylindrical body (cylinder) is made upstanding relative to a substrate. FIGS. 1A to 1D are diagrams for explaining the steps of the manufacturing method of the high-molecular thin film having a fine structure.

Figure 1A:
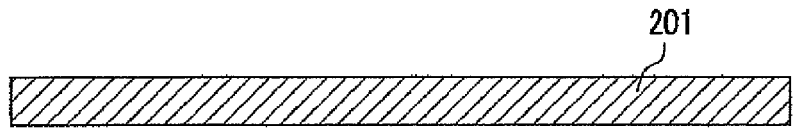
FIGS. 1A to 1D are diagrams for explaining steps of a manufacturing method of a high-molecular thin film having a fine structure according to an embodiment of the present invention.

FIG. 1A shows a substrate 201 for forming a high-molecular thin film M (see FIG. 1D) having a structure to be discussed later. The substrate 201 is patterned as follows.

Figure 1B:

As shown in FIG. 1B, a surface of the substrate 201 is so patterned as to be a surface formed of a first material 106 and another surface formed of a second material 107 which has different chemical properties from the first material 106.

Figure 1C:
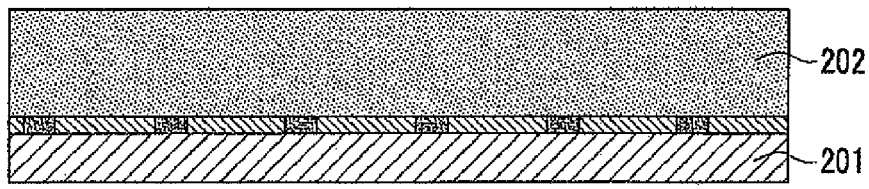

Next, as shown in FIG 1C, a film 202 of block-copolymer composition is coated on the surface of the substrate 201.

Figure 1D:
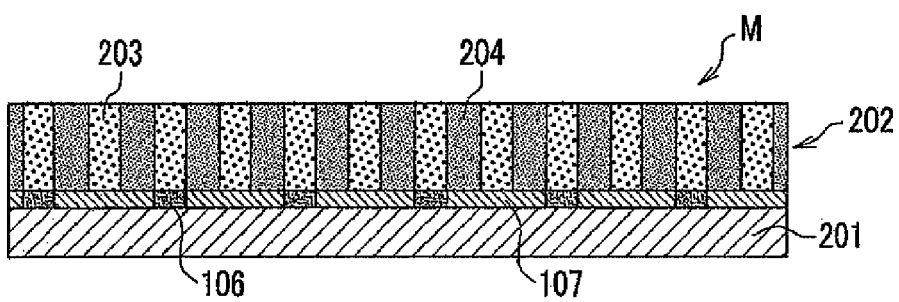

According to the manufacturing method, as shown in FIG. 1D, formed on the substrate 201 by microphase separation of the block-copolymer-composition film 202 is a fine structure having microdomains (cylindrical body) 203 each of which is formed of a polymeric phase P1 mainly composed of a polymer block chain A1 (see FIG. 2) to be discussed later, and which has undergone phase separation in a continuous phase 204 formed of a polymeric phase P2 mainly composed of a polymer block chain A2 (see FIG. 2) to be discussed later.

Figure 2:
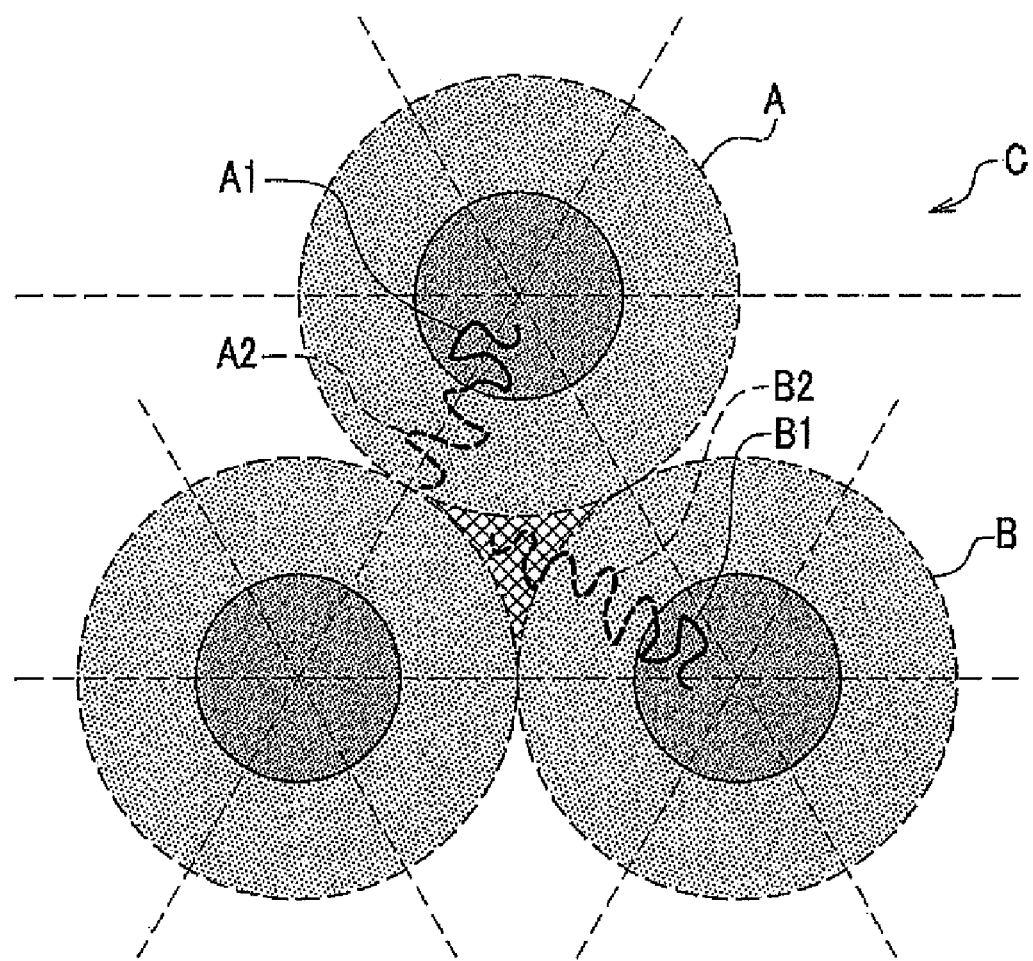
FIG. 2 is a conceptual diagram showing how polymer block chains are formed in a block-copolymer compound.

At this time, relative to the surface formed of the first material 106 shown in FIG. 1B, the polymeric phase P1 (see FIG. 1D) mainly composed of the polymer block chain A1 (see FIG. 2) has a better wettability than the polymeric phase P2 (see FIG. 1D) mainly composed of the polymer block chain A2 (see FIG. 2). Also, relative to the surface formed of the second material 107, the polymeric phase P2 mainly composed of the polymer block chain A2 (see FIG. 2) has a better wettability than the polymeric phase P1 mainly composed of the polymer block chain A1. In other words, interfacial tension of the polymeric phase P1 to the surface formed of the first material 106 is smaller than interfacial tension against the surface formed of the second material 107, and interfacial tension of the polymeric phase P2 against the surface formed of the first material 106 is larger than interfacial tension against the surface formed of the second material 107.

A chemical condition of the surface of the substrate 201 is designed in this fashion, and desirably, by controlling a thickness t of the block-copolymer-composition film 202 so as to be within a predetermined range satisfying a relational expression (2) to be discussed later, as shown in FIG. 1D, the microdomain (cylindrical body) 203 of the polymeric phase P1 mainly composed of the polymer block chain A1 (see FIG. 2) is arranged on the surface formed of the first material 106, and the continuous phase 204 of the polymeric phase P2 mainly composed of the polymer block chain A2 (see FIG. 2) is arranged on the surface formed of the second material 107. That is, a high-molecular thin film M having a fine structure formed of the microdomain 203 and the continuous phase 204 is thus formed on the substrate 201. Note that, as discussed below, the microdomain 203 formed on the second material 107 is interpolated.

Next, an explanation will be given of materials and the like used for the manufacturing method of the high-molecular thin film M having a fine structure according to the present invention.

<Block-Copolymer Composition>

The block-copolymer composition is mainly composed of a block copolymer A including at least the polymer block chain A1 and the polymer block chain A2, and is combined with, as an accessory constituent, a block copolymer B including a polymer block chain B1 which is miscible with the polymeric phase P1 mainly composed of the polymer block chain A1, and a polymer block chain B2 which is miscible with the polymeric phase P2 mainly composed of the polymer block chain A2.

According to such a combination, when, for example, the block-copolymer composition is subjected to phase separation so that the microdomain 203 (see FIG. 1D) mainly composed of the polymer block chain A1 and the continuous phase 204 (see FIG. 1D) mainly composed of the polymer block chain A2 are developed, a condition in which the polymer block chain B1 becomes selectively miscible with the microdomain 203 and the polymer block chain B2 becomes selectively miscible with the continuous phase 204 is realized.

Examples of the block copolymer A are a polystyrene-block-polymethylmethacrylate copolymer (hereinafter, "PS-b-PMMA") having polymethylmethacrylate as the polymer block chain A1 and polystyrene as the polymer block chain A2, and a polystyrene-block-polydimethylsiloxane having polydimethylsiloxane as the polymer block chain A1 and polystyrene as the polymer block chain A2. The present invention is, however, not limited to those block copolymers, various combinations which can cause microphase separation to be developed can be adopted.

Note that the block copolymer A can be synthesized by an appropriate technique, but in order to improve the regularity of the microphase-separated structure, a synthesis technique with the distribution of molecular weights narrow as much as possible is preferable. An example of an applicable synthesis technique is a living polymerization technique.

An example of the block copolymer B is, when the PS-b-PMMA is the block copolymer A, one having the following polymer block chain B1 and polymer block chain B2.

Examples of the polymer block chain B1 are the same polymethylmethacrylate and polydimethylsiloxane as the polymer block chain A1, and macro-molecules miscible with polymethylmethacrylate or the like, such as a styrene-acrylonitrile copolymer, an acrylonitrile-butadiene copolymer, a vinylidene-fluoride-trifluoroethylene copolymer, a vinylidene-fluoride-tetrafluoroethylene copolymer, a vinylidene-fluoride-hexafluoroacetone copolymer, a vinylphenol-styrene copolymer, a vinylidene-chloride-acrylonitrile copolymer, and a vinylidene-fluoride homopolymer.

Examples of the polymer block chain B2 are the same polystyrene as the polymer block chain A2, and macro-molecules miscible with polystyrene, such as polyphenyleneether, polymethylvinylether, poly-α-methylstyrene, and nitrocellulose.

Note that such macro-molecules may have different miscibility depending on a molecular weight, a concentration, a temperature, and a composition, so that it is desirable to set those conditions appropriately to bring a good miscible state.

Next, an explanation will be given of a molecular weight relation between the block copolymer A and the block copolymer B. If the molecular weight of the polymer block chain A1 is Mn(A1), the molecular weight of the polymer block chain A2 is Mn(A2), and the molecular weight of the polymer block chain B2 is Mn(B2), it is then necessary that those molecular weights satisfy following relational expression (1).

$$\text{Mn}(A2) > \text{Mn}(A1) \text{ and } \text{Mn}(B2) > \text{Mn}(A2) \quad \text{Relational expression (1):}$$

By combining the block copolymer A and the block copolymer B having molecular weights satisfying the relational expression (1), it is possible to manufacture a high-molecular thin film having a fine structure which can suppress any macroscopic phase separation that is a problem of the chemical registration technique at the time of pattern formation, and which can reduce nonuniformity of sizes of patterns and defects thereof.

If the condition of the block-copolymer composition satisfying the relational expression (1) is explained with reference to short and long polymer block chains, it can be expressed as follows. FIG. 2 is a conceptual diagram showing how the polymer block chains are formed in the block-copolymer composition.

As shown in FIG. 2, a block-copolymer composition C can be one such that the polymer block chain A2 of the block copolymer A has a larger molecular weight Mn than that of the polymer block chain A1 of the block copolymer A, and the polymer block chain B2 of the block copolymer B has a larger molecular weight Mn than that of the polymer block chain A2 of the block copolymer A.

In the block copolymer C shown in FIG. 2, ones having the same length as the polymer block chain A1 of the block copolymer A and the same molecular weight Mn as the polymer block chain B1 of the block copolymer B are used.

In such a block-copolymer composition, it is desirable that a whole mass fraction of the block copolymer A which is the main constituent is greater than or equal to 75% and less than or equal to 95%.

By setting the mass fraction to be within this range, it is possible to surely suppress any macroscopic phase separation of the block copolymer A with the block copolymer B which is an accessory constituent.

The molecular weight of the polymer block chain constituting the block-copolymer composition and the proportion thereof can be set depending on a target shape of a pattern and a target size thereof with the foregoing conditions being satisfied.

Note that when the block-copolymer composition is subjected to microphase separation to the polymeric phase P1 (see FIG. 1D) mainly composed of the polymer block chain A1 and the polymeric phase P2 (see FIG. 1D) mainly composed of the polymer block chain A2, as a percentage of the polymeric phase P1 relative to the whole volume increases from 0% to 50%, the structure of the polymeric phase P1 changes from a spherical microdomain arranged regularly in a matrix of the polymeric phase P2 to a structure in which a tabular (lamella) microdomain formed of the polymeric phase P1 and a lamella microdomain formed of the polymeric phase P2 are alternately arranged through a cylindrical microdomain shape.

When the percentage of the polymeric phase P1 relative to the whole volume further increases, the structure of the polymeric phase P1 changes from a lamella microdomain to a matrix-like structure in which spherical microdomain formed of the polymeric phase P2 are arranged regularly through a matrix-like structure in which the lamella microdomain formed of the polymeric phase P2 are arranged regularly.

The size of the pattern can be mainly defined by the total molecular weight of the block copolymer A, and the larger the total molecular weight is, the larger the size of the pattern becomes.

Note that the explanation has been of an example in which the block copolymer A is a diblock copolymer having two kinds of polymer block chains A1, A2 joined together, but the present invention is not limited to such a copolymer. The block copolymer A can be, for example, other ABA type triblock copolymers, a linear block copolymer like an ABC type block copolymer having greater than or equal to three kinds of polymer block chains, or a star-type block copolymer.

As explained above, the block-copolymer composition of the embodiment causes a cylindrical and lamella structure to be developed by microphase separation. The structure of a pattern developed by the block-copolymer composition and the size thereof are unique depending on the molecular weight of the block copolymer and the composition thereof. It is defined in the embodiment that a period of the regular structure developed by microphase separation is a natural period "do".

Figure 3A:
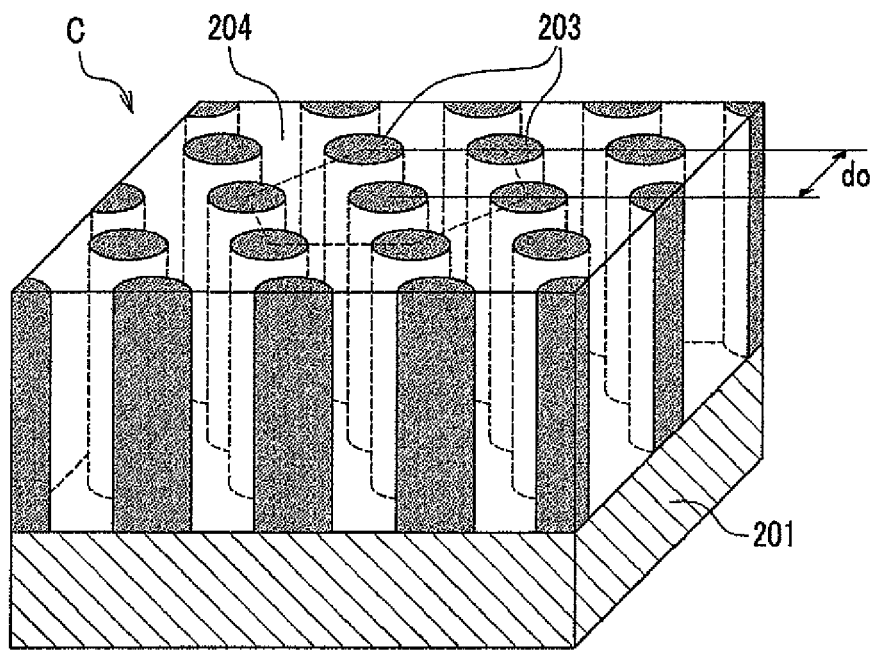
FIG. 3A is a perspective view exemplary showing how a structure of cylindrical patterns are formed by microphase separation of the block-copolymer composition.
Figure 3B:
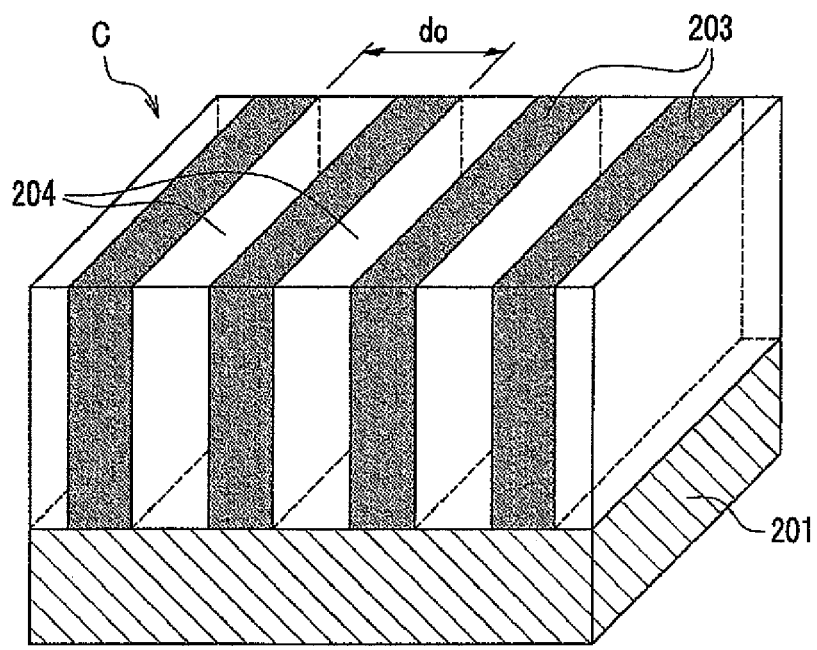
FIG. 3B is a perspective view exemplary showing how a structure of lamella patterns are formed by microphase separation of the block-copolymer composition.

FIG. 3A is a perspective view exemplary showing how a structure of cylindrical patterns are formed by microphase separation of the block-copolymer composition, and FIG. 3B is a perspective view exemplary showing how a structure of lamella patterns is formed by microphase separation of the block-copolymer composition.

As shown in FIG. 3A, a structure of cylindrical patterns formed by microphase separation of the block-copolymer composition C on the substrate 201 has the microdomains 203 each in a cylindrical shape are packed hexagonally and arranged regularly. In this case, the natural period do is defined by a lattice spacing of a hexagonal array. As shown in FIG. 3B, the natural period do in the case of a structure in which the lamella microdomain 203 and the lamella continuous phase 204 are arranged alternately is defined by a space between lamellas.

<Substrate>

According to the chemical registration technique, as explained above, the surface of the substrate 201 shown in FIG. 1B is patterned to the surface formed of the first material 106 and the surface formed of the second material 107 having a different chemical property from the first material 106. An explanation will be mainly given of a patterning method of the surface of the substrate 201.

A material of the substrate 201 shown in FIG. 1A is not limited to any particular one, but examples of such a material are inorganic materials like glass and titania, semiconductors like silicon and GaAs, metals like copper, tantalum and titanium, and organic materials like an epoxy resin and polyimide. The material of the substrate 201 can be selected appropriately in accordance with a purpose.

An explanation will be given of a method of patterning the surface of the substrate 201. FIGS. 4A to 4G are diagrams for explaining the steps of the patterning method of the surface of the substrate. Note that an explanation will be given of a case in which the block copolymer A which is the main constituent of the block-copolymer composition is the PS-b-PMMA. That is, it is assumed that, as shown in FIG. 1D, the continuous phase 204, mainly composed of the polymer block chain A2 (polymeric phase P2) formed of polystyrene, and the cylindrical microdomain 203, mainly composed of the polymer block chain A1 (polymeric phase P1) formed of polymethylmethacrylate, are developed by microphase separation.

Figure 4A:
FIGS. 4A to 4G are diagrams for explaining steps of a patterning method of a surface of a substrate.

First, as shown in FIG. 4A, according to this method, the substrate 201 is prepared. The substrate 201 composed of silicon is prepared.

Figure 4B:
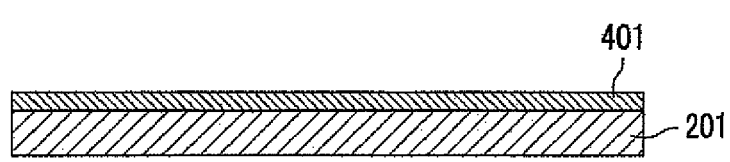

Next, as shown in FIG. 4B, a chemically-modified layer 401 is formed on the surface of the substrate 201 to cause the entire surface of the substrate 201 to have a better wettability with polystyrene rather than polymethylmethacrylate.

Examples of how to form the chemically-modified layer 401 are a technique of applying a silane coupling agent on the surface of the substrate 201 and of forming a unimolecular film, and a technique of introducing a high-molecular compound on the surface of the substrate 201. A specific example of the technique of forming a unimolecular film is a technique of forming a unimolecular film of silane compounds having a phenethyl-base on the surface of the substrate 201 using, for example, phenethyltrimethoxysilane.

Also, an example of the technique of introducing a high-molecular compound is a technique of grafting a high-molecular compound miscible with, for example, polystyrene on the surface of the substrate 201. Regarding grafting of the high-molecular compound, examples of such a technique are a technique of introducing a functional group which is a base of initiation of polymerization on the surface of the substrate 201 by coupling or the like, and of polymerizing the high-molecular compound from the polymerization initiation base, and a technique of synthesizing a high-molecular compound having a functional group, to be coupled with the surface of the substrate 201, at a terminal or a main chain, and of coupling such compound with the surface of the substrate 201. The latter technique is simple and is recommended.

In the embodiment, an explanation will be given of a method of grafting polystyrene on the surface of the substrate 201 formed of silicon in order to make the surface of the substrate 201 preferable (having better wettability) to polystyrene in more detail.

According to this method, polystyrene having a hydroxyl group at a terminal thereof is synthesized by a predetermined living polymerization. Next, the substrate 201 is exposed to oxygen plasma, or is dipped in a piranha solution to increase the density of the hydroxyl groups possessed by a native oxide film formed on the substrate 201. Thereafter, polystyrene having the hydroxyl group at a terminal thereof is dissolved in a solvent like toluene, and is applied on the substrate 201 by spin coating method or the like to form a film. The obtained substrate 201 is heated at a temperature of approximately 170° C. for approximately 72 hours under a vacuum atmosphere using a vacuum oven or the like. By this process, the hydroxyl group on the surface of the substrate 201 and the hydroxyl group at the terminal of polystyrene are condensed with each other in a dehydrated manner, so that the surface of the substrate 201 and polystyrene are combined together. Finally, the substrate 201 is rinsed with a solvent like toluene to remove polystyrene not combined with the substrate 201, thereby obtaining the substrate 201 having grafted polystyrene.

The molecular weight of the high-molecular compound grafted on the surface of the substrate 201 is not limited to any particular one, but if such a molecular weight is from approximately 1000 to approximately 10000, it is desirable because a super thin film of the high-molecular compound having a thickness of several nm can be formed on the surface of the substrate 201.

Next, the chemically-modified layer 401 provided on the surface of the substrate 201 is patterned. Regarding how to pattern such a layer, conventionally well-known patterning techniques, such as photolithography and electron beam lithography can be applied appropriately in accordance with a desired pattern size.

Figure 4C:
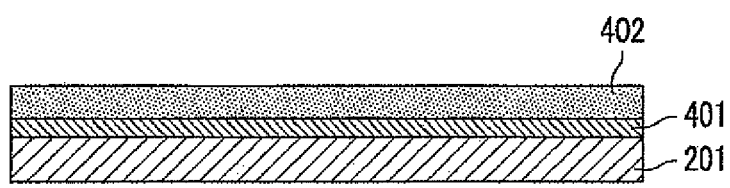
Figure 4D:
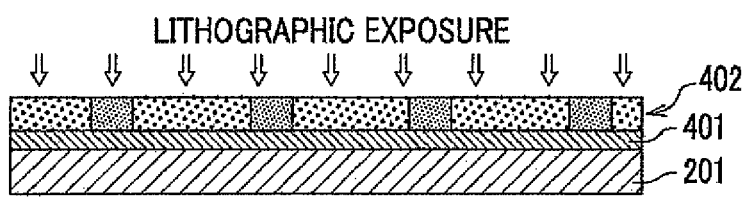
Figure 4E:
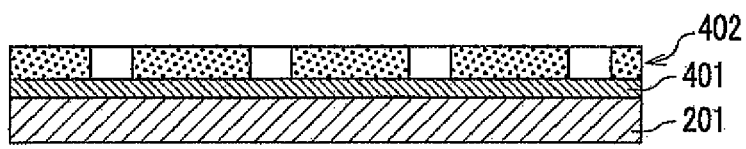
Figure 4F:
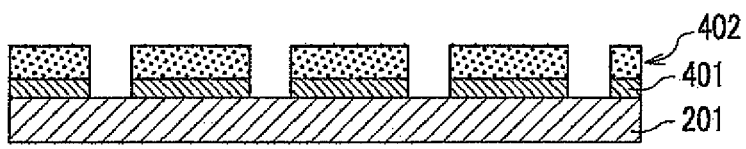
Figure 4G:

More specifically, as shown in FIG. 4C, a resist film 402 is formed on a surface of the chemically-modified layer 401. Next, as shown in FIG. 4D, the resist film 402 is patterned by lithographic exposure, and as shown in FIG. 4E, the resist film 402 is caused to become a pattern mask by development. Thereafter, as shown in FIG. 4F, as etching by oxygen plasma or the like is performed via the resist film 402 serving as the pattern mask, the chemically-modified layer 401 is partially eliminated correspondingly to the resist film 402 serving as the pattern mask. Next, as shown in FIG. 4G, the remaining resist film 402 is eliminated, so that the patterned chemically-modified layer 401 is obtained on the substrate 201.

According to such a method, the chemically-modified layer 401 formed of patterned polystyrene can be obtained on the surface of the substrate 201 formed of silicon. More specifically, the surface of the substrate 201 having undergone chemical modification is separately patterned to a surface where silicon is exposed and a surface with the chemically-modified layer 401 formed of polystyrene. Note that the surface formed of the chemically-modified layer 401 corresponds to the "surface formed of the first material" in claims and a part where silicon is exposed corresponds to the "surface formed of the second material".

Such a chemically-modified substrate 201 has a characteristic that the silicon surface prefers polymethylmethacrylate rather than polystyrene, and as a result, the polymeric phase P1 formed of polymethylmethacrylate is formed on the silicon surface by microphase separation. Also, the surface formed of the chemically-modified layer 401 prefers polystyrene rather than polymethylmethacrylate, and as a result, the polymeric phase P2 formed of polystyrene is formed on the surface of the chemically-modified layer 401 by microphase separation.

The explanation has been given of the patterning method of the surface of the substrate 201 in the case in which the block-copolymer compound is mainly composed of PS-b-PMMA. However, the substrate surface can be also chemically-patterned by the same fashion when other block-copolymer compounds are used.

Note that the steps shown in from FIG. 4C to FIG. 4G are just examples, and other methods can be applied if the chemically-modified layer 401 (see FIG. 4B) formed on the surface of the substrate 201 can be patterned.

The chemically-modified layer 401 obtained by the foregoing steps is, as shown in FIG. 4G, formed as the thin film on the substrate 201, but the present invention is not limited to this form.

Figure 5A:
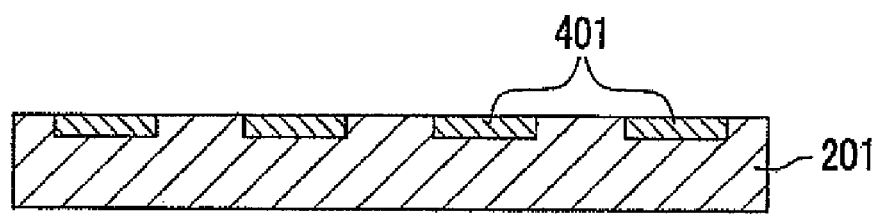
FIGS. 5A and 5B are schematic diagrams showing a chemically-modified layer formed on the substrate in other forms.
Figure 5B:
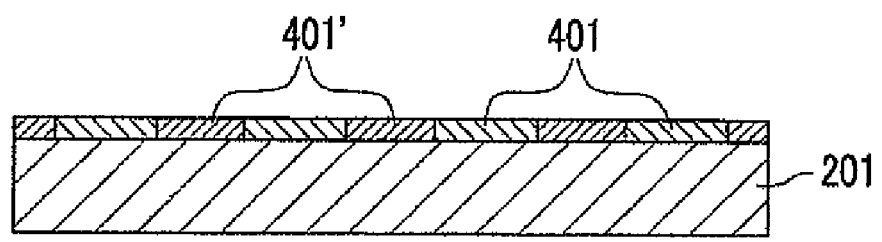

FIGS. 5A and 5B are schematic diagrams showing a chemically-modified layer formed on the substrate in other forms.

As shown in FIG. 5A, the chemically-modified layer 401 may be embedded discretely inside the substrate 201, or, as shown in FIG. 5B, a chemically-modified layer 401 may be buried discretely inside a thin film 401' formed on the surface of the substrate 201 and having a different chemical property from the chemically-modified layer 401. An example of a technique of forming the substrate shown in FIG. 5B is a technique of forming the chemically-modified layer 401 on the substrate 201 at first as shown in FIG. 4G, and of performing the foregoing chemical modification, thereby forming the thin film 401' different from the chemically-modified layer 401 on the exposed surface part of the substrate 201.

Next, an explanation will be given of the chemical registration technique used in the embodiment.

The chemical registration technique improves the long-range orderliness of a microphase-separated structure, formed by self-assembling of the block copolymer, by a chemical mark provided on the surface of the substrate 201 (see FIGS. 4A to 4G). According to the chemical registration technique, a defect of a chemical mark can be interpolated by self-assembling of the block copolymer.

FIG. 6A (a-1) is a conceptual diagram showing how a defect of chemical mark is interpolated using the block-polymer compound of the embodiment, and FIG. 6B (a-2) is a cross-sectional view along a line X-X in FIG. 6A (a-1). FIG. 6C (b-1) is a conceptual diagram showing a condition that a defect of chemical mark is not interpolated even though the block copolymer of a comparative example is used, and FIG. 6D (b-2) is a cross-sectional view along a line Y-Y in FIG. 6C (b-1).

A the block-copolymer compound of the embodiment is used, as shown in FIG. 6A (a-1), the cylindrical microdomains 203 are hexagonally arranged at a natural period do regularly. The microdomain 203 is formed on a chemical mark 205 surrounded by a circle with a continuous line. At a part where there is a defect of the chemical mark 205 (a part not surrounded by a circle with a continuous line in FIG. 6A (a-1)), the cylindrical microdomains 203 around the defect bind a microphase-separated structure of the block-copolymer compound at the defect part. As a result, as shown in FIG. 6B (a-2), the cylindrical microdomains 203 are arranged vertically to the substrate 201, so that the defect can be interpolated.

On the other hand, when the compound which does not contain, for example, the block copolymer B but contains the block copolymer A only is used, as shown in FIG. 6C (b-1), as the number of defects of chemical mark 205 increases, as shown in FIG. 6D (b-2), the microdomain 203 is microphase-separated in such a manner as to be parallel to the substrate 201 at a defect part. This is because the cylindrical microdomains 203 may be gathered at the surface if there are lots of defects, and thus a parallel part to the substrate 201 may be produced.

According to the embodiment, however, the chemical mark 205 is interpolated by using the block-copolymer compound containing at least the block copolymer A and the block copolymer B. As will be discussed later, it is desirable to surely arrange the microdomains 203 so as to be vertical to the substrate 201 by controlling the film thickness of the block-polymer compound formed on the substrate 201 at the first step. As a result, according to the high-molecular thin film of the embodiment having the fine structure, it is possible to improve the long-range orderliness of the microphase-separated structure, and to reduce any defects thereof.

By using the block-copolymer compound of the embodiment, the interpolation rate of defects can be improved, and if a ratio between the density of microdomains 203 and the density of patterns represented by the density of chemical marks 205 is n:1, n can be set to be a number greater than 1, moreover, greater than or equal to 4. Also, if n is set to be less than or equal to 16, interpolation of defects can be further surely accomplished.

Providing that the patterns on the surface of the substrate 201 are arranged at an average period ds, it is desirable that such an average period ds should be larger than the natural period do of the microdomain 203 (natural period do of the block copolymer) by what corresponds to a natural integer.

Figure 7A:
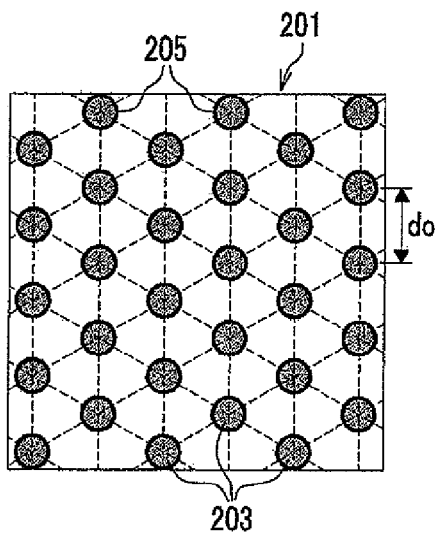
FIG. 7A is a conceptual diagram showing a condition in which chemical marks are arranged across the entire substrate surface at a natural period do (hexagonal period) of the block-copolymer compound of the embodiment and the block-copolymer compound is microphase-separated.
Figure 7C:
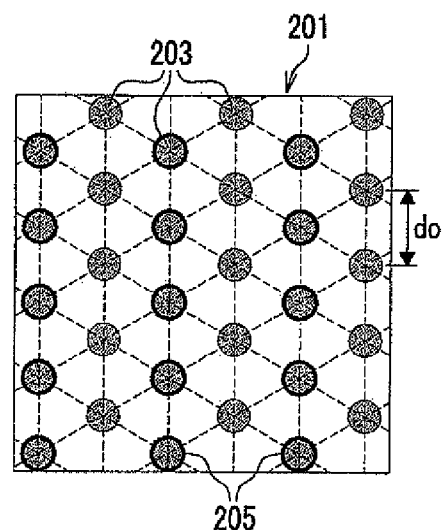
FIG. 7C is a conceptual diagram showing a condition in which chemical marks are arranged with a defect rate of 50% and the block-copolymer compound is microphase-separated.
Figure 7B:
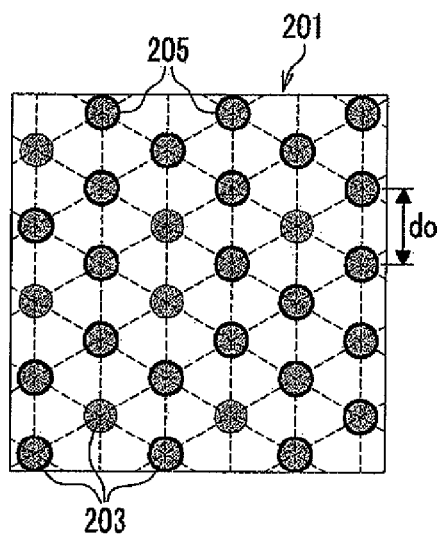
FIG. 7B is a conceptual diagram showing a condition in which chemical marks are arranged with a defect rate of 25% and the block-copolymer compound is microphase-separated.
Figure 7D:
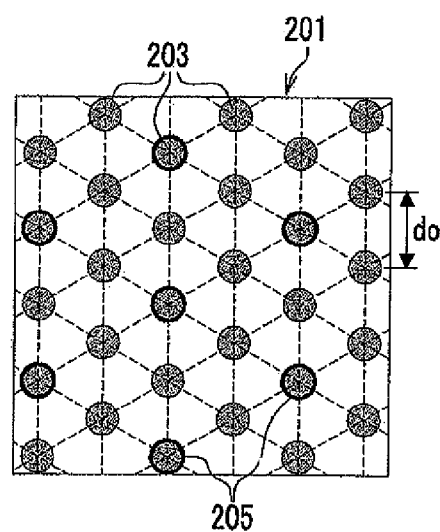
FIG. 7D is a conceptual diagram showing a condition in which chemical marks are arranged with a defect rate of 75% and the block-copolymer compound is microphase-separated.

An explanation will be given of a representative example of a pattern having the chemical mark 205 interpolated by applying the chemical registration technique of the embodiment. FIG. 7A is a conceptual diagram showing a condition in which the chemical marks are arranged across the entire surface of the substrate at the natural period do (hexagonal period) of the block-copolymer compound of the embodiment and the block-copolymer compound is microphase-separated. FIG. 7B is a conceptual diagram showing a condition in which the chemical marks are arranged with a defect rate of 25% and the block-copolymer compound is microphase-separated. FIG. 7C is a conceptual diagram showing a condition in which the chemical marks are arranged with a defect rate of 50% and the block-copolymer compound is microphase-separated. FIG. 7D is a conceptual diagram showing a condition in which the chemical marks are arranged with a defect rate of 75% and the block-copolymer compound is microphase-separated.

As shown in FIG. 7A, when the substrate 201 having the chemical marks 205 arranged hexagonally (defect rate of chemical mark: 0%) is used, the block-copolymer compound of the embodiment allows the microdomain 203 to be upstanding at a position corresponding to the chemical mark 205 by microphase separation (at the hexagonal natural period do).

As shown in FIG. 7B, when the substrate 201 having the chemical marks 205 arranged with a defect rate of 25% is used, the block-copolymer compound of the embodiment allows the microdomain 203 to be upstanding at a position corresponding to the defect part of the chemical mark 205 because such a microdomain is bound by another microdomain 203 upstanding around the defect part of the chemical mark 205. That is, the defect part of the chemical mark 205 can be interpolated as the block-copolymer compound of the embodiment is used, so that chemical registration is achieved with good precision.

Also, as shown in FIG. 7C, when the substrate 201 having the chemical marks 205 arranged with a defect rate of 50% (pattern density: ½), and more specifically, the substrate 201 having the chemical marks 205 arranged with one line interval is used, the block-copolymer compound of the embodiment allows the microdomain 203 to be upstanding at a position corresponding to the defect of the chemical mark 205 because such a microdomain is bound by another microdomains 203 upstanding around the defect of the chemical mark 205. That is, the defect part of the chemical mark 205 can be interpolated as the block-copolymer compound of the embodiment is used, so that chemical registration is achieved with good precision.

Also, as shown in FIG. 7D, when the substrate 201 having the chemical marks 205 arranged with a defect rate of 75% (pattern density: ¼), and more specifically, the substrate 201 which has the chemical marks 205 arranged with one line interval further arranged with additional one line interval is used, the block-copolymer compound of the embodiment allows the microdomain 203 to be upstanding at the position corresponding to the defect of the chemical mark 205 although the binding force of the microdomains 203 upstanding around the defect of the chemical mark 205 is weak. That is, the defect part of the chemical mark 205 can be interpolated as the block-copolymer compound of the embodiment is used, so that chemical registration is achieved with good precision.

<Film Formation and Microphase Separation of Block-Copolymer Compound>

An explanation will be given of a method of forming a film of the block-copolymer compound on the chemically-patterned substrate 201 and of causing microphase separation to be developed.

First, the block-copolymer compound is dissolved in a solvent to obtain a dilute block-copolymer-compound solution. Next, as shown in FIG. 1C, the block-copolymer-compound solution is applied on the chemically-patterned surface of the substrate 201. An application technique is not limited to any particular one, and for example, spin coating or dip coating can be used. In the case of spin coating, if, for example, the concentration of the solution is set to be several % by weight or so and the rotating speed is set to be 1000 to 5000 per minute, it becomes possible to stably obtain a thin film of the block-copolymer compound having a thickness of several ten nm.

It is desirable that a film thickness (dried film thickness) t of the block-copolymer compound satisfies following relational expression (2).

$$(m+0.3) \times do < t < (m+0.7) \times do \quad \text{Relational expression (2):}$$

(where m in the relational expression (2) is an integer greater than or equal to 0)

By setting the film thickness t of the block-copolymer compound in this fashion, it becomes possible to carry out the chemical registration technique more precisely.

Regarding the symbol m in the relational expression (2), there is no specific upper limit, but it is desirable that such m should be less than or equal to five times as much as the natural period do of the block-copolymer compound, i.e., should be greater than or equal to 0 and less than or equal to 5 in order to maximize the effect of the chemical registration technique.

The film of block-copolymer compound formed on the chemically-patterned surface of the substrate 201 in this fashion generally has an unbalanced structure depending on the film formation technique. That is, due to rapid vaporization of the solvent at the time of film formation, the microphase separation of the block-copolymer compound does not progress well, so that the block-copolymer compound is frozen with the structure thereof being in an unbalanced state or being completely in a disordered state in many cases. Accordingly, the substrate 201 is annealed in order to make the progression of microphase separation of the block-copolymer compound well advanced and to obtain a balanced structure. Examples of such annealing are thermal annealing of leaving the substrate 201 in a state being heated at a temperature higher than or equal to the glass transition temperature of the block-polymer compound, and solution annealing of leaving the substrate 201 in a state being exposed to the good solvent vapor of the block-copolymer compound. In a case of the block-copolymer compound mainly composed of the PS-b-PMMA, the thermal annealing is easy, and can be completed by heating a substrate for several hours to several days at a temperature from 170 to 200° C. under a vacuum atmosphere.

<Pattern Medium>

Next, an explanation will be given of the pattern medium obtained by utilizing the foregoing high-molecular thin film M. FIGS. 8A to 8F are process drawings for explaining a manufacturing method of a pattern medium using the high-molecular thin film having the fine structure according to the embodiment. Note that a surface having chemically different properties and present in a patterned condition is omitted in FIGS. 8A to 8F. In the following explanation, a pattern medium means one having a concave-convex face formed on a surface thereof corresponding to the pattern of a regular arrangement of a microphase-separated structure.

According to the manufacturing method, first, as shown in FIG. 8A, the high-molecular thin film M having a microphase-separated structure of the continuous phase 204 and cylindrical microdomains 203 is prepared. Reference numeral 201 denotes the substrate.

Next, according to the manufacturing method, as shown in FIG. 8B, the microdomains 203 (see FIG. 8A) are eliminated, thereby obtaining a pattern medium 21 as a porous thin film D having plural pores H arranged regularly.

In this step, it is appropriate if either the continuous phase 204 or the microdomains 203 are eliminated, and it is not illustrated in FIG. 8A but a pattern having plural cylindrical microdomains arranged regularly may be obtained by eliminating the continuous phase 204 in the microphase-separated structure.

An example of technique of eliminating either the continuous phase 204 or the cylindrical microdomains 203 of the high-molecular thin film M is a technique of utilizing a difference between the etching rate of the continuous phase 204 and that of the microdomain 203 by reactive ion etching (ME) or other etching techniques.

Examples of such a block copolymer which enables formation of the high-molecular thin film that either one of the high-molecular phases can be selectively eliminated are polybutadiene-block-polydimethylsiloxane, polybutadiene-block-poly-4-vinylpyridine, polybutadiene-block-polymethylmethacrylate, polybutadiene-block-poly-t-butylmethacrylate, polybutadiene-block-poly-t-butylacrylate, poly-t-butylmethacrylate-block-poly-4-vinylpyridine, polyethylene-block-polymethylmethacrylate, poly-t-butylmethacrylate-block-poly-2-vinylprydine, polyethylene-block-poly-2-vinylpyridine, polyethylene-block-poly-4-vinylpyridine, polyisoprene-block-poly-2-vinylprydine, poly-t-butylmethacrylate-block-polystyrene, polymethylacrylate-block-polystyrene, polybutadiene-block-polystyrene, polyisoprene-block-polystyrene, polystyrene-block-poly-2-vinylpyridine, polystyrene-block-poly-4-vinylpyridine, polystyrene-block-polydimethylsiloxane, polystyrene-block-poly-N,N-dimethylacrylamide, polybutadiene-block-sodium-polyacrylate, polybutadiene-block-polyethyleneoxide, poly-t-buthylmethacrylate-block-polyetyleneoxide, and polystyrene-block-polyacrylate, in addition to the foregoing block polymer A.

Also, it is possible to improve the etching selectivity by doping metal atoms or the like in either high-molecular phase of the continuous phase 204 and the microdomain 203. For example, in the case of the block copolymer of polystyrene-block-polybutadiene, a high-molecular phase of polybutadiene facilitates doping of osmium in comparison with a high-molecular phase of polystyrene. By utilizing such an effect, it is possible to improve the etching tolerability of a domain of polybutadiene.

Also, the pattern medium 21 can be obtained by eliminating either the continuous phase 204 or microdomain 203 and by etching the substrate 201 with either one of the remaining continuous phase 204 and microdomain 203 being as a mask.

That is, the substrate 201 is subjected to etching, such as the RIE, or plasma etching, using remaining another high-molecular phase (porous thin film D) like the continuous phase 204 shown in FIG. 8B as a mask. As a result, as shown in FIG. 8C, surface portions of the substrate 201 each corresponding to an eliminated portion of the high-molecular phase are processed via respective pores H, so that the pattern of a microphase-separated structure is transferred on the surface of the substrate 201. As the porous thin film D remaining on the surface of the pattern medium 21 is eliminated by the RIE or a solvent, as shown in FIG. 8D, a pattern medium 21a having the pores H formed on the surface thereof with a pattern corresponding to the cylindrical microdomains 203 can be obtained.

Also, the pattern medium 21 may be a replica obtained by transferring the pattern arrangement of the pattern medium 21 serving as a master mold.

That is, remaining another high-molecular phase (porous thin film D) like the continuous phase 204 shown in FIG. 8B may be caused to tightly contact a processing object 30 as shown in FIG. 8E, and the pattern of the microphase-separated structure may be transferred to a surface of the processing object. Thereafter, as shown in FIG. 8F, by removing the processing object 30 from the pattern medium 21 (see FIG. 8E), a replica (pattern medium 21b) to which the pattern of the porous thin film D (see FIG. 8E) is transferred can be obtained.

A material of the processing object 30 can be selected in accordance with the application thereof, and examples of such are metals like nickel, platinum, and gold, and organic materials like glass and titania. When the processing object 30 is formed of a metal, it is possible to cause the processing object 30 to tightly contact the concave-convex face of the pattern substrate by sputtering, vapor deposition, plating and a combination thereof.

Also, when the processing object 30 is formed of an organic material, it is possible to cause the processing object 30 to tightly contact the pattern substrate by, for example, sputtering, CVD (Chemical Vapor Deposition), and a sol-gel technique. According to plating and the sol-gel technique, it becomes possible to highly-accurately transfer the pattern of a regular arrangement in several ten nm of a microphase-separated structure, so that such techniques are preferable from the standpoint of accomplishment of cost reduction by a non-vacuum process.

The patterned media 21, 21a, and 21b obtained by the foregoing manufacturing method have a fine concave-convex pattern face formed on the surface thereof and have a large aspect ratio, so that such media can be used in various kinds of applications.

For example, the manufactured patterned media 21, 21a, and 21b can be used in an application of manufacturing large numbers of replicas of the patterned media 21, 21a, and 21b having a pattern on the surface thereof with the same regular arrangement by repeatedly causing the surface of the pattern medium 21, 21a, 21b to be tightly contact processing objects by nano imprinting or the like.

Next, an explanation will be given of a method of transferring a fine pattern of the concave-convex face of the pattern medium 21, 21a, 21b to the processing object 30 by nano imprinting.

A first method performs imprinting of the manufactured pattern medium 21, 21a, 21b directly to the processing object 30 to transfer the pattern of the regular arrangement (this method is called a thermal imprinting method). This method is appropriate if the processing object 30 is formed of a material permitting direct imprinting. For example, when the processing object 30 is a thermoplastic resin represented by polystyrene, the thermoplastic resin is heated at a temperature higher than or equal to a glass transition temperature, the pattern medium 21, 21a, 21b is pressed against the processing object 30 so as to tightly contact the processing object 30, both are cooled down to a temperature less than or equal to the glass transition temperature, and the pattern medium 21, 21a, 21b is released from the surface of the processing object 30, thereby obtaining a replica.

As a second method, when the pattern medium 21, 21a, 21b is formed of a light transmissive material like a glass, a light transmissive resin is used as a processing object (not shown) (this method is called a photo imprinting method). The light transmissive resin is caused to tightly contact the pattern medium 21, 21a, 21b and is irradiated with light, then the light transmissive resin is caused to harden, so that the pattern medium 21, 21a, 21b is released therefrom, and the hardened light transmissive resin (processing object) can be used as a replica.

Further, in such photo imprinting method, when a glass substrate or the like is used as a processing object (not shown), a photo-curable resin is filled in a space between the pattern substrate and a substrate of the processing object superimposed with each other, and is irradiated with light. Thereafter, the photo-curable resin is caused to harden, and then the pattern substrate is released therefrom, and etching is performed with plasmas or ion beams using the hardened photo-curable resin having concavities and convexities on the surface thereof as a mask, thereby obtaining the pattern of the regular arrangement on the substrate of the processing object.

<Magnetic Recording Pattern Medium>

Next, an explanation will be given of a magnetic recording medium as an example of a device realized by the present invention.

Improvement of a data recording density is always requisite for magnetic recording media. In order to satisfy such a requisition, a dot on a magnetic recording medium which is a base unit of data retaining is made minute, and a space between adjoining dots is made narrower and narrower to accomplish densification.

Note that in order to configure a recording medium with a recording density of 1 terabit/square inch, it is necessary to set the period of dot arrangement pattern to approximately 25 nm. Accordingly, as the densification of dots advances, magnetism given in order to make a dot activated/deactivated may affect other adjoining dots.

Therefore, in order to eliminate an effect of magnetism leaked from adjoining dots, a pattern medium (not shown in figures) in which dot areas over a magnetic recording media are physically separated is studied.

The foregoing pattern media 21, 21a, and 21b can be used as such a pattern medium or as a master mold for manufacturing such a patterned media. In particular, it is necessary for a magnetic recording patterned media to arrange fine concavities and convexities across a whole disk surface regularly without any defects. The present invention is effective for improvement of the throughput when chemical patterns are plotted on a whole disk surface.

EXAMPLES

Next, the present invention will be explained in more detail with reference to examples.

In the examples, block-copolymer compounds formed of two kinds of PS-b-PMMA having different molecular weights were each applied on a substrate.

<Patterning of Substrate>

Si wafers each having a native oxide film were prepared as the substrate. Polystyrene was grafted on an entire surface of the substrate, and a polystyrene-graft layer formed on the surface of the substrate was patterned by electron beam (EB) lithography. The substrate was patterned in such a manner as to have surface portions with different wettability to polystyrene and polymethylmethacrylate, respectively.

The procedures will be explained in more detail below.

The substrate having polystyrene grafted thereon was produced by the following method. First, an Si wafer (four inch (102 mm)) having a native oxide film was rinsed by a piranha solution. The Piranha process had an oxidization effect so that organic substances on a surface of the substrate was eliminated and the density of hydroxyl groups on the surface was increased as the surface of the Si wafer was oxidized. Next, a toluene solution (concentration: 1.0% by weight) containing polystyrene (PS—OH) having a hydroxyl group at a molecular-chain terminal thereof was applied on the surface of the Si wafer using a spin coater (made by MIKASA, co., ltd., 1H-360S). The rotating speed of the spin coater was set to 3000 rpm. The molecular weight of the PS—OH used was 3700. A film of PS—OH formed on the substrate had a thickness of approximately 50 nm.

Next, the substrate coated with PS—OH was heated for 48 hours at a temperature of 140° C. in a vacuum oven. By this heat treatment, hydroxyl group at the terminal of PS—OH bound chemically to hydroxyl group on the surface of the substrate by dehydration reaction. Finally, unreacted PS—OH was eliminated from the substrate. The elimination of the unreacted PS—OH was carried out by dipping the substrate in toluene and by performing an ultrasonic treatment.

In order to evaluate a surface condition of the substrate having polystyrene grafted thereon, a thickness of a polystyrene graft layer, an amount of carbon on the surface of the substrate and a contact angle of polystyrene relative to the surface of the substrate were measured. Spectroscopic ellipsometry was carried out for measurement of the thickness of the polystyrene graft layer. X-ray photoelectron spectroscopy (XPS) was carried out for quantitative determination of the amount of carbon. The thickness of the polystyrene graft layer was 5.1 nm. The amounts of carbon on the surface of the substrate before and after grafting of polystyrene were 4500 cps and 27000 cps, respectively, as an integral intensity of the peak originating from C1S.

The contact angle of polystyrene was measured by the following method.

First, homo-polystyrene (hps) having a molecular weight of 4000 was applied on the surface of the substrate by spin coating so as to form a film thereof having a thickness of approximately 80 nm.

Next, the substrate with an hps film was annealed for 24 hours at a temperature of 170° C. in a vacuum atmosphere. By this annealing, the hps thin film was subjected to dewetting on the substrate surface, and became fine hps droplets. After the annealing by heating, the substrate was dipped in liquid nitrogen to rapidly cool down the droplets from a heating temperature, so that the shape of the hps droplet was frozen. Thereafter, a cross-sectional shape of the droplet was observed using an atomic force microscope, and an angle between the substrate and the interface of the droplet was measured, thereby obtaining the contact angle of hps relative to the substrate at the heating temperature in annealing. At this time, the measurement of an angle was carried out at six points, and an average value thereof was obtained as the contact angle.

The contact angle of hps was 9 degree. That is, it became smaller than the contact angle of 35 degree relative to the Si wafer prior to grafting. It was confirmed from the result that the polystyrene graft layer was formed on the surface of the Si wafer.

Figure 9A:
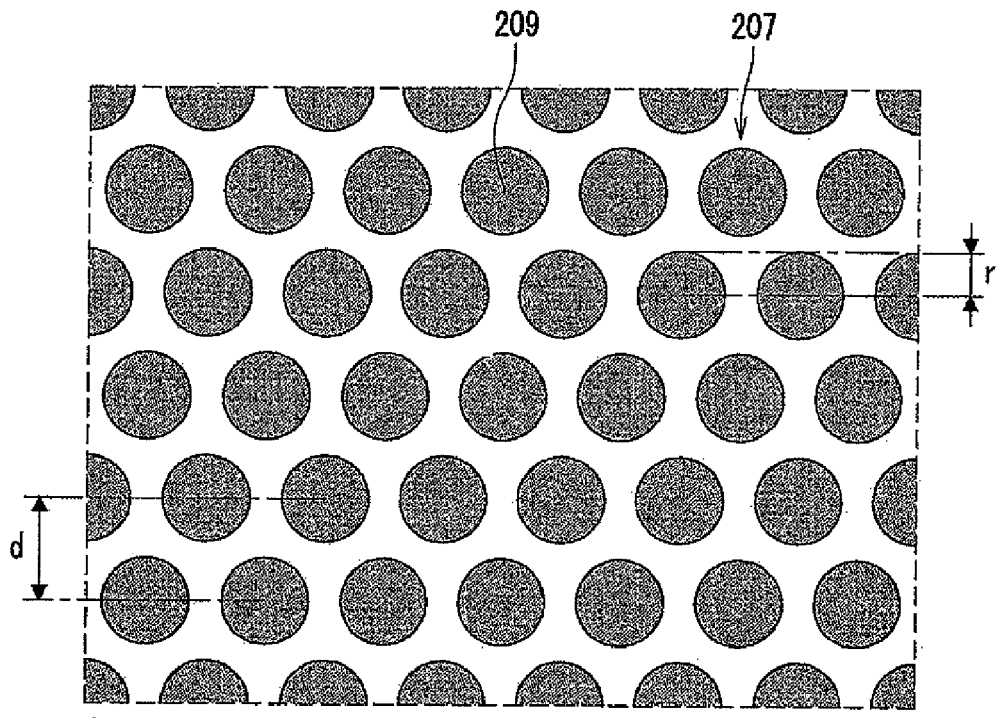
FIG. 9A is a plan view showing a patterned polystyrene graft layer partially enlarged.

Next, the polystyrene graft layer of the substrate was patterned by EB lithography. FIG. 9A is a plan view showing the patterned polystyrene graft layer partially enlarged, and FIG. 9B is a plan view exemplary showing an arrangement of areas having different lattice spacing d.

As shown in FIG. 9A, the base Si wafer 209 was exposed with circular shapes to be discussed later each having a radius of r through a surface of the patterned polystyrene graft layer 207, and the polystyrene graft layer 207 was partially eliminated in such a way that the circular exposed portions were hexagonally arranged at a lattice spacing d to be discussed layer.

Figure 9B:
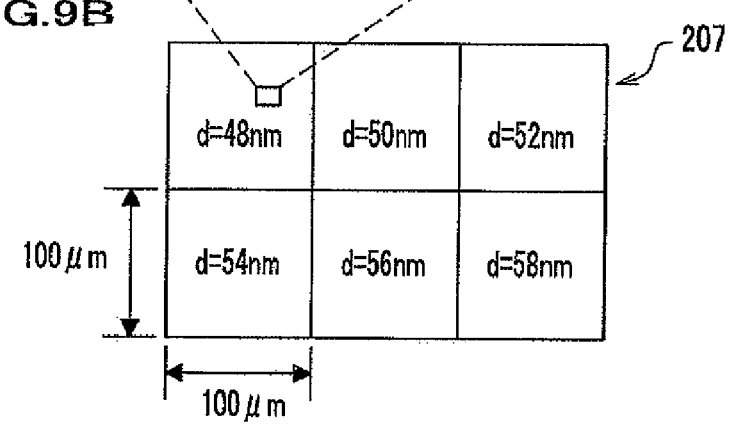
FIG. 9B is a plan view exemplary showing an arrangement of areas having different lattice spacing d.

In the foregoing patterning of the surface of the polystyrene graft layer 207, as shown in FIG. 9B, the circular exposed portions were formed in such a way that the lattice spacing d was changed to be 48 nm, 50 nm, 52 nm, 54 nm, 56 nm, and 58 nm for each area sectioned 100 μm by 100 μm. Note that a radius r of the circle of the sectioned area was set to be approximately 25 to 30% of each lattice spacing d.

Next, an explanation will be given of a patterning method of the substrate 201 having the polystyrene graft layer in more detail with reference to FIGS. 4B to 4G.

The substrate 201 shown in FIG. 4B was the Si wafer, and the chemically-modified layer 401 was the polystyrene graft layer, such a wafer was diced in a size 2 cm by 2 cm, and the diced piece was used.

As shown in FIG. 4C, the resist layer 402 formed of polymethylmethacrylate and having a thickness of 85 nm was formed on the surface of the polystyrene graft layer (chemically-modified layer 401) by spin coating method.

Next, as shown in FIG. 4D, the resist film 402 was exposed so as to correspond to the foregoing pattern at an accelerating voltage of 100 kV using an EB lithography device. The radius r of the pattern (circle) was adjusted by an EB exposure amount at each lattice point. Thereafter, as shown in FIG. 4E, the resist film 402 was developed.

Next, as shown in FIG. 4F, using the patterned resist film 402 as a mask, the polystyrene graft layer (chemically-modified layer 401) was etched by reactive dry etching (RIE) with the aid of an oxygen gas. The RIE was performed using an ICP dry etching device. At this time, the output of the device, the pressure of the oxygen gas, the flow rate of the oxygen gas, and the etching time were set to 40 W, 4 Pa, 30 cm³/minute, and 5 to 10 seconds, respectively.

Thereafter, as shown in FIG. 4G the resist film 402 remaining on the surface of the substrate 201 was eliminated by toluene, thereby obtaining a patterned polystyrene graft layer (chemically-modified layer 401) on the surface of the substrate 201.

First and Second Examples and First and Second Comparative Examples

Two kinds of PS-b-PMMA among four kinds of PS-b-PMMA were selected to prepare block-copolymer compounds.

chain B1 with a number-averaged molecular weight Mn(B1) of 21000. A molecular-weight distribution Mw/Mn as whole PS-b-PMMA was 1.09. This accessory constituent is denoted as PS(46k)-b-PMMA(21k) in table 1.

Accordingly, the block-copolymer compound of the first examples satisfied the foregoing relational expression (1).

PS-b-PMMA used as an accessory constituent in the second example (corresponding to the foregoing block copolymer B) had polystyrene chain as the polymer block chain B2 with a number-averaged molecular weight Mn(B2) of 52000, and had polymethylrnethacrylate chain as the polymer block chain B1 with a number-averaged molecular weight Mn(B1) of 52000. A molecular-weight distribution Mw/Mn as whole

TABLE 1

| | PS-b-PMMA COMPOUND | | | PATTERN | FILM | CHEMICAL REGISTRATION | |
|---|---|---|---|---|---|---|---|
| | MAIN CONSTITUENT | ACCESSORY CONSTITUENT | WEIGHT FRACTION OF ACCESSORY CONSTITUENT | UNIQUE PERIOD do (nm) | PERIOD d(nm) OF SUBSTRATE | THICKNESS (nm) | INTERPOLATION RATE (%) | PATTERN PRECISION (nm) |
| FIRST EXAMPLE | PS (36k)-b-PMMA (12k) | PS (46k)-b-PMMA (21k) | 10 | 25 | 50 | 25 | 70 | — |
| | | | | | | 38 | 100 | 2.1 |
| | | | 20 | 26 | 52 | 26 | 75 | — |
| | | | | | | 40 | 100 | 2.0 |
| | | | 30 | 28 | 56 | 28 | 10 | — |
| | | | | | | 42 | 25 | 3.0 |
| SECOND EXAMPLE | | PS (52k)-b-PMMA (52k) | 10 | 26 | 52 | 26 | 60 | — |
| | | | | | | 40 | 85 | — |
| FIRST COMPARATIVE EXAMPLE | | NONE | 0 | 24 | 48 | 25 | 5 | — |
| | | | | | | 38 | 100 | 2.6 |
| SECOND COMPARATIVE EXAMPLE | | PS (13k)-b-PMMA (13k) | 10 | 24 | 48 | 25 | 5 | — |
| | | | | | | 38 | 100 | 2.8 |
| THIRD COMPARATIVE EXAMPLE | | PS (46k)-b-PMMA (21k) | 20 | 26 | 78 | 40 | 100 | 2.5 |

First, the four kinds of PS-b-PMMAs used will be explained.

The block copolymer A contained as a main constituent in the block-copolymer compound had a polystyrene chain as the high-molecular chain A2 with a number-averaged molecular weight Mn(A2) of 35500, and had a polymethylmethacrylate chain as the polymer block chain A1 with a number-averaged molecular weight Mn(A1) of 12200. A molecular-weight distribution Mw/Mn as whole PS-b-PMMA was 1.04. This main constituent is denoted as PS(36k)-b-PMMA(12k) in table 1.

The block copolymer A had polystyrene chain with a number-averaged molecular weight Mn(A2) of 35500, and had polymethylmethacrylate chain with a number-averaged molecular weight Mn(A1) of 12200, so that a microphase-separated structure in which cylindrical microdomains of polymethylmethacrylate were arranged in a continuous phase of polystyrene was formed.

With respect to the block copolymer A, as shown in table 1, the following three kinds of PS-b-PMMAs were contained as an accessory constituent in the block-copolymer compound in first and second examples and a second comparative example.

Note that only the foregoing block copolymer A was used in a first comparative example.

PS-b-PMMA used as an accessory constituent in the first example (corresponding to the foregoing block copolymer B) had polystyrene chain as the polymer block chain B2 with a number-averaged molecular weight Mn(B2) of 46100, and had polymethylmethacrylate chain as the polymer block PS-b-PMMA was 1.10. This accessory constituent is denoted as PS(52k)-b-PMMA(52k) in table 1.

Accordingly, the block-copolymer compound of the second example satisfied the foregoing relational expression (1).

PS-b-PMMA used as an accessory constituent in the second comparative example had polystyrene chain corresponding to the polymer block chain B2 with a number-averaged molecular weight Mn of 12800, and had polymethylmethacrylate chain corresponding to the polymer block chain B1 with a number-averaged molecular weight Mn of 12900. A molecular-weight distribution Mw/Mn as whole PS-b-PMMA was 1.05. This accessory constituent is denoted as PS(13k)-b-PMMA(13k) in table 1.

The block-copolymer compound of the second comparative example did not satisfy the foregoing relational expression (1).

<Measurement of Natural Period do of Block-Copolymer Compound>

The natural period do of each block-copolymer compound (PS-b-PMMA compound) shown in table 1 was set as follows. First, a sample of each PS-b-PMMA compound shown in table 1 was dissolved in semiconductor grade toluene, and a toluene solution of the PS-b-PMMA compound of 1.0% by weight was obtained.

Next, the solution was applied on a surface of a silicon substrate by spin coating, and a thin film having a dried film thickness of 45 nm was formed. The substrate was subjected to annealing for 24 hours at a temperature of 170° C. using a vacuum oven, so that the PS-b-PMMA composition on the substrate was microphase-separated, and a self-assembly structure in a balanced state was developed. The microphase-separated structure of the self-assembled PS-b-PMMA composition was observed using an SEM (Scanning Electron Microscope).

S4800 made by HITACHI Ltd., was used for SEM observation, and an accelerating voltage was set to 0.7 kV. A sample for the SEM observation was produced as follows.

First, cylindrical microdomains present in the thin film of PS-b-PMMA were resolved and eliminated by oxygen RIE. As a result, a high-molecular thin film having a concave-convex shape in a nano scale originating from the microphase-separated structure was obtained. RIE-10NP made by SAMCO Inc., was used for RIE. At this time, an oxygen gas pressure, a flow rate of oxygen gas, an output of the device, and an etching time were set to 1.0 Pa, 10 cm$^3$/minute, 20 W, and 30 seconds, respectively.

In order to measure a fine structure precisely, the vapor deposition of Pt or the like on a sample surface which was normally performed for prevention of static charge was not performed in the SEM observation, and a necessary contrast was obtained by adjusting an accelerating voltage.

Figure 10B:
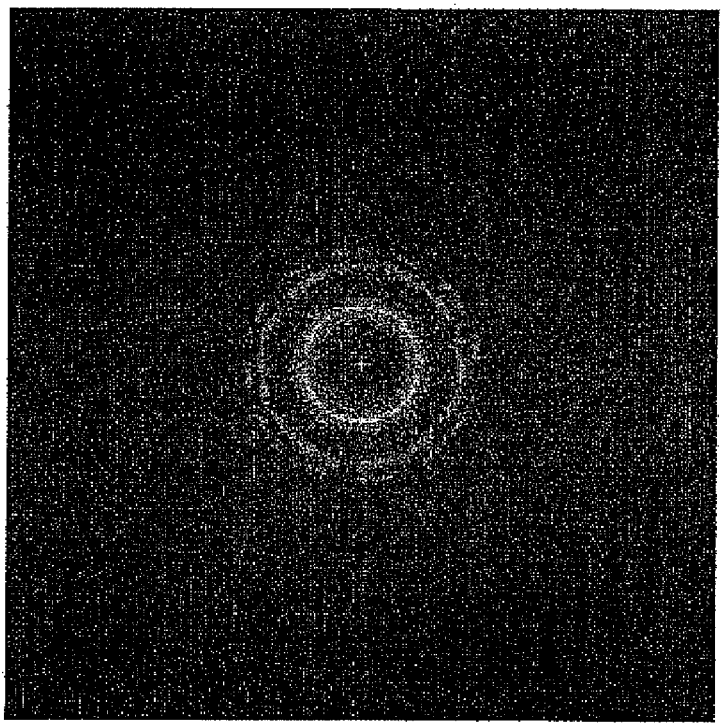
FIG. 10B is a photo of a two-dimensional Fourier transformation image of cylindrical microdomains arranged in the first example.
Figure 10A:
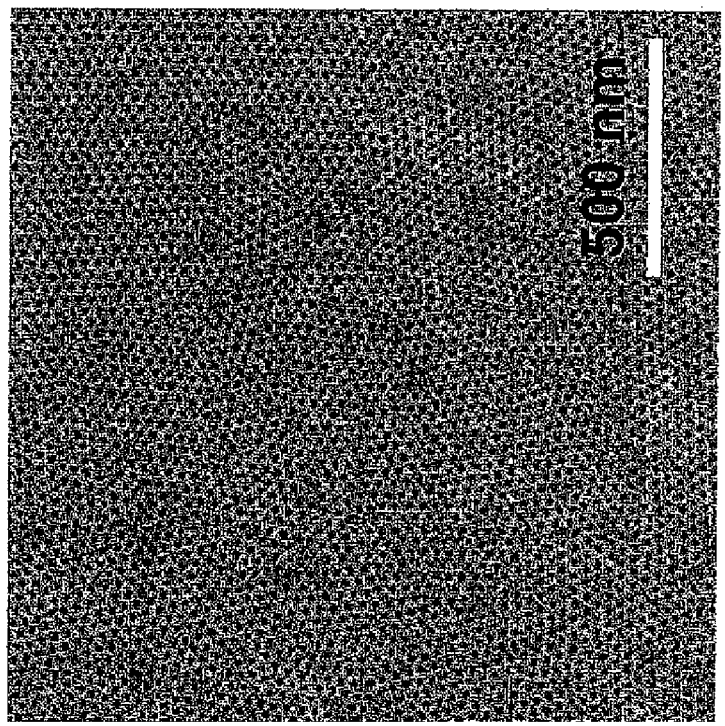
FIG. 10A is an SEM (Scanning Electron Microscope) photo of a microphase-separated structure in a first example.

FIG. 10A is an SEM photo of a microphase-separated structure in the first example, and FIG. 10B is a photo of a two-dimensional Fourier transformation image of cylindrical microdomains arranged in the first example.

As shown in FIG. 10A, the PS-b-PMMA compound used in the first example arranged cylindrical microdomains hexagonally in a condition upstanding relative to the substrate.

The natural period do of the PS-b-PMMA compound was obtained based on such an SEM observation image.

Setting of the natural period do was performed by a two-dimensional Fourier transformation using a general-purpose image processing software. As shown in FIG. 10B, a two-dimensional Fourier transformation image of the cylindrical microdomains arranged on the substrate provides a halo pattern that large numbers of spots gathered, so that the natural period do was obtained from a first halo radius. The natural period do obtained for each PS-b-PMMA compound is shown in Table 1.

<Chemical Registration Technique>

A thin film of a self-assembled PS-b-PMMA compound was formed on a chemically-patterned surface of a substrate by the same fashion as that of the setting of the natural period do of the block-copolymer compound, and a pattern shape in the obtained thin film of the PS-b-PMMA compound was observed using an SEM.

Figure 11C:
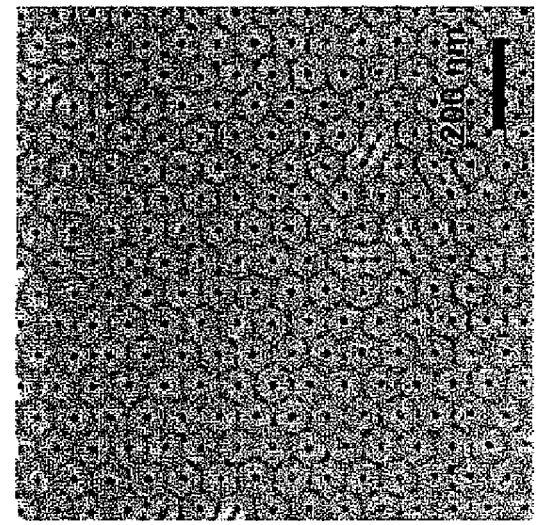
FIGS. 11A to 11C are scanning microscopy photos of a pattern formed by a block-copolymer compound on a chemically-patterned surface of a substrate.
Figure 11B:
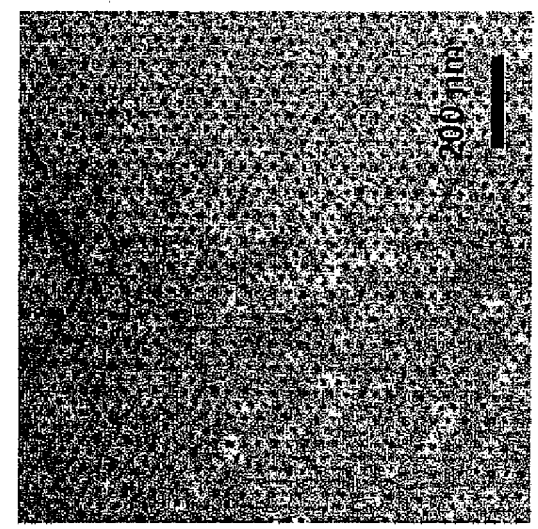
Figure 11A:
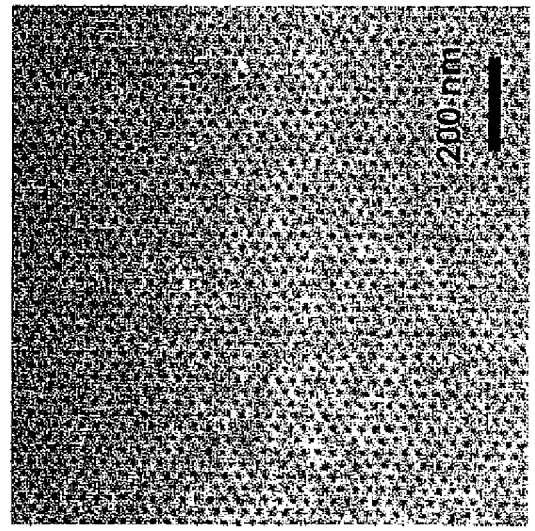

FIGS. 11A to 11C show representative results. FIG. 11A shows an SEM observation result when a cylindrical structure was interpolated between chemical patterns by self-assembling of PS(36k)-b-PMMA(12k) on a chemically-patterned substrate at a lattice spacing d of 48 nm. As a cylindrical microdomain of polymethylmethacrylate formed by PS-b-PMMA selectively got wet to an exposed part of a surface of an Si wafer which was the chemically-patterned substrate, the position of such microdomain was bound. A continuous phase of polystyrene formed by PS-b-PMMA selectively got wet to a polystyrene graft layer on the patterned surface of the substrate. Further, between patterns, as PS-b-PMMA was controlled with a film thickness, cylindrical microdomains were arranged upstanding relative to the substrate, the arrangement of the cylindrical microdomains between the patterns were bound by cylindrical microdomains arranged regularly at an exposed part of the Si wafer, so that it is visible that the cylindrical microdomains are arranged periodically across a long range.

In contrast, FIG. 11B shows a representative pattern that interpolation of patterns by the chemical registration technique was imperfect. An SEM image shown in FIG. 11B is often observed when the film thickness of a high-molecular thin film is similar to the natural period do of polymers, and the pattern was partially interpolated likewise FIG. 11A, but at a part where no Si wafer was exposed, i.e., between patterns, there were large numbers of areas where cylindrical microdomains were not upstanding relative to the substrate.

FIG. 11C shows an example in which no interpolation of a pattern was substantially observed in self-assembling of PS(36k)-b-PMMA(12k).

Next, FIGS. 12A to 12D show representative results of studying an effect of a PS-b-PMMA composition and that of a film thickness thereof relative to making a density quadruple by interpolating adjoining lattice points using a chemically-patterned substrate and by making a lattice spacing double.

Figure 12C:
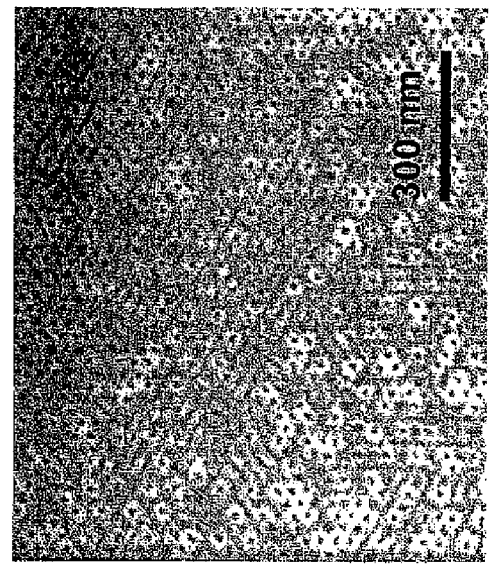
FIGS. 12A (a-1) to 12D (b-2) are scanning microscopy photos of a pattern formed by a block-copolymer compound on a chemically-patterned surface of a substrate.
Figure 12D:
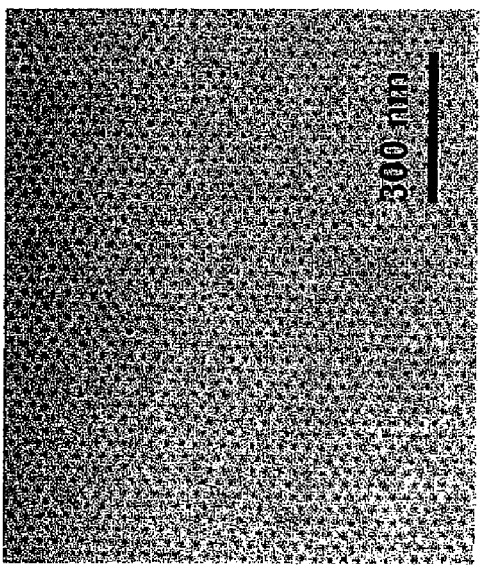
Figure 12A:
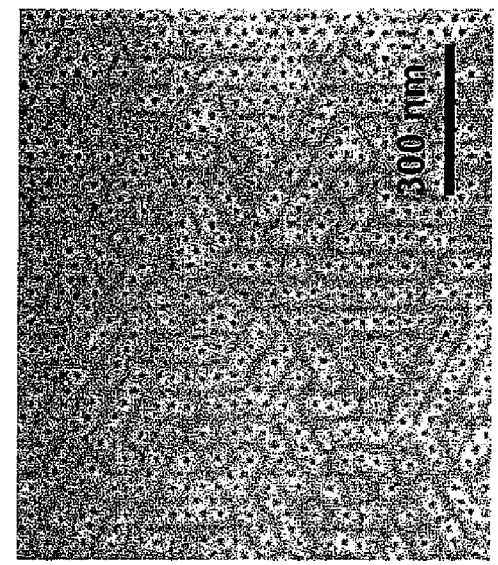
Figure 12B:
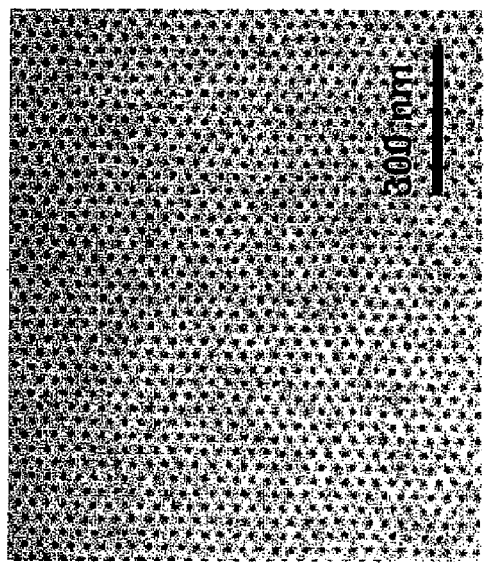
Figure 13A:
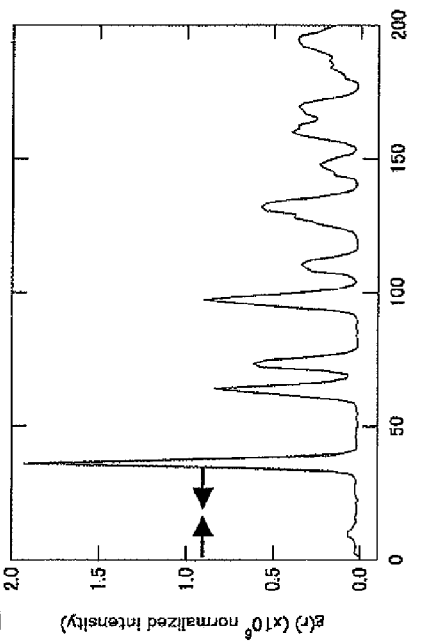
FIGS. 13A to 13D are diagrams showing a method of evaluating a pattern precision.
Figure 13C:
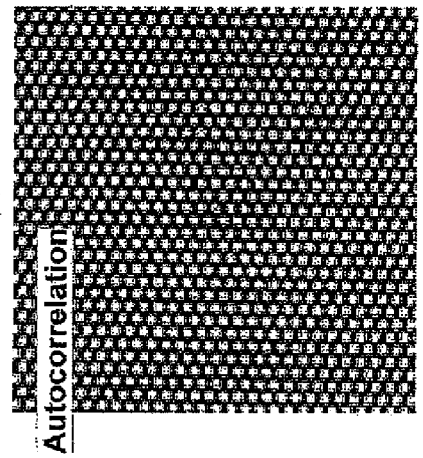
Figure 13B:
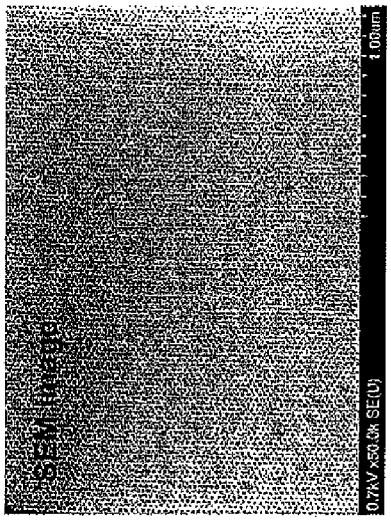
Figure 13D:
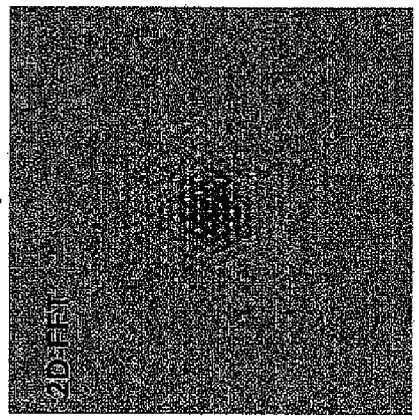
Figure 14:
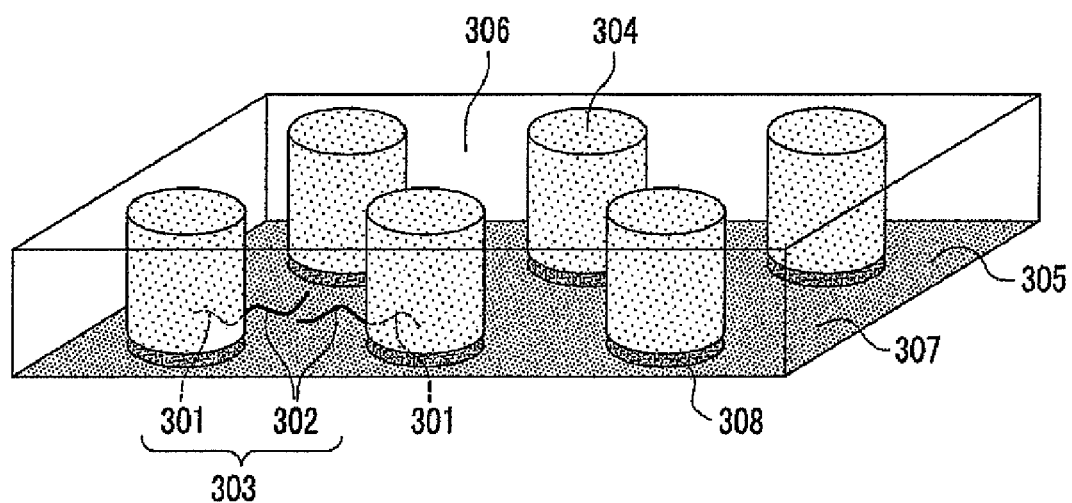
FIG. 14 is a conceptual perspective view for explaining a conventional method of chemically patterning a substrate surface.

FIGS. 12A (a-1) and 12B (a-2) are SEM images of high-molecular thin films each obtained by using a single system of PS(36k)-b-PMMA(12k). The natural period do of this system was 24 nm, FIG. 12A (a-1) had a film thickness of 25 nm, and FIG. 12B (a-2) had a film thickness of 38 nm. Because the single system of PS(36k)-b-PMMA(12k) had the natural period do of 24 nm, FIG. 12A (a-1) had the film thickness corresponding to substantially 1.0 period and FIG. 12B (a-2) had the film thickness corresponding to substantially 1.5 period. First, in FIG. 12B (a-2), substantially-complete pattern interpolation by the chemical registration technique was observed. In contrast, in FIG. 12A (a-1), at a part where no Si wafer was exposed, i.e., between patterns, most cylindrical microdomains were not upstanding relative to the substrate, so that pattern interpolation by the chemical registration technique was not accomplished.

Next, FIGS. 12C (b-1) and 12D (b-2) are SEM images of high-molecular thin films each obtained using a blended system containing PS(36k)-b-PMMA(12k) as a main constituent and PS(46k)-b-PMMA(21k) as an accessory constituent at a ratio by weight of 80:20. The natural period do of this system was 26 nm, FIG. 12C (b-1) had a film thickness of 26 nm, and FIG. 12D (b-2) had a film thickness of 40 nm. Because a single system of PS(36k)-b-PMMA(12k) had the natural period of 24 nm, FIG. 12C (b-1) had the film thickness corresponding to substantially 1.0 period, and FIG. 12D (b-2) had the film thickness corresponding to substantially 1.5 period. First, in FIG. 12D (b-2), like FIG. 12B (a-2), substantially-complete pattern interpolation by the chemical registration technique was observed. In contrast, in FIG. 12C (b-2), obtained at a part where no Si wafer was exposed, i.e., between patterns, was a result that an area where the cylindrical microdomains were not upstanding relative to the substrate and an area where the chemical registration was accomplished were mixed.

Next, a state of the chemical registration technique was evaluated by a following barometer based on an SEM image. First, an interpolation rate by the chemical registration technique was defined as follow, and was set from an SEM image.

Interpolation rate (%)=a number of interpolated lattice points÷a number of chemical-pattern-lithography defects of a substrate Regarding a case in which the interpolation rate became substantially 100%, the precision of a pattern obtained by the chemical registration technique was obtained by techniques shown in FIGS. 13A to 13D. First, a weighted center position of lattices was set from an SEM image shown in FIG. 13A by an image processing, and an image showing the distribution thereof was obtained. The image was subjected to two-dimensional Fourier transformation. Next, each pixel of an obtained two-dimensional Fourier transformation image was squared, and an inverse Fourier transformation thereof was performed, thereby obtaining a two-dimensional auto-correlation function image of the weighted-center distribution image of lattices shown in FIG. 13B. Further, a two-dimensional auto-correlation function image shown in FIG. 13C was subjected to an annulus average process with the center of the image being as a center, and a radial distribution function of a weighted center shown in FIG. 13D was set. By fitting a first-order peak of the radial distribution function to a Gauss function, a standard deviation of a first-order peak, i.e., a standard deviation of a distance between closest lattices was obtained as a pattern precision. Interpolation rate and pattern precision were obtained for each example and comparative example, and the results are shown in table 1.

First, when the film thickness t of the block-copolymer compound was 1.5 times or so as much as the natural period do, an interpolation rate of substantially 100% was accomplished, and it became clear that good interpolation was possible.

Regarding a pattern precision, in comparison with a single system of PS(36k)-b-PMMA(12k), it became clear that a smaller value, i.e., a pattern with a better precision was obtained in the case of a system with which 10% by weight or 20% by weight of PS(46k)-b-PMMA(21k) was mixed as an accessory constituent.

When the film thickness t of the block-copolymer compound was 1.0 times or so as much as the natural period do, an interpolation rate became approximately 5% in the cases of a single system of PS(36k)-b-PMMA(12k) and a system of PS(36k)-b-PMMA(12k) with which PS(13k)-b-PMMA(13k) was mixed as an accessory constituent, and it became clear that the pattern interpolation was substantially impossible.

In contrast, in the case of a system which contained PS(36k)-b-PMMA(12k) as a main constituent and with which 10% by weight or 20% by weight of PS(46k)-b-PMMA(21k) was mixed as an accessory constituent, or a system which contained PS(36k)-b-PMMA(12k) as a main constituent and with which 10% by weight of PS(52k)-b-PMMA(52k) was mixed as an accessory constituent, an interpolation rate became 60 to 75%, so that remarkable improvement was confirmed.

Note that in the case of a system which contained PS(36k)-b-PMMA(12k) as a main constituent and with which PS(46k)-b-PMMA(21k) was mixed as an accessory constituent, when the weight fraction of the accessory constituent was 30%, no improvement of a pattern interpolation rate was confirmed.

From the foregoing results, when the block-copolymer compound satisfies the foregoing relational expression (1), and desirably, when a weight fraction of an accessory constituent is within a range from 5% to 25%, it becomes clear that a pattern interpolation rate by the chemical registration technique is improved.

Also, when the film thickness t of the block-copolymer compound and a natural period do thereof are in a relation satisfying the foregoing relational expression (2), it becomes clear that good pattern interpolation is generally achieved.

In this case, when the block-copolymer compound satisfies the foregoing relational expression (1), and desirably, when a weight fraction of an accessory constituent is within a range from 5% to 25%, it becomes clear that a pattern with a better pattern precision can be formed.

Third Example

In the foregoing examples and comparative examples, although a lattice spacing d of a substrate of a chemical pattern was set to be twice as much as a natural period do of PS-b-PMMA, a case in which a lattice spacing d of a substrate was set to be three times as much as a natural period do of PS-b-PMMA was studied as a third example. A test was carried out by the same method and the same block-copolymer compound as the first example except that a substrate formed with a chemical pattern having a spacing d three times as much as the natural period do was prepared and used. That is, because the natural period do of the block-copolymer compound was 26 nm, a substrate was made in such a way that the spacing d of the chemical pattern on the substrate became 78 nm. A film thickness was set to 40 nm which corresponded to approximately 1.5 times as much as the natural period do. Table 1 shows an obtained result. In this study, the defect rate of chemical mark was 89% which was a very large value, but an obtained interpolation rate became 100%. This result suggests that the density of a pattern can be made nine times by applying the present invention.

As explained above, it is demonstrated that cylindrical microdomains can be arranged regularly between a lattice spacing d by self-assembling as a PS-b-PMMA compound having a molecular weight and a mixing ratio both defined in the present invention is used as a film thickness thereof is controlled. This result suggests that the throughput in direct lithography of a chemical pattern can be improved and there is also a possibility that a finer pattern can be formed uniformly beyond the boundary of the lithography technology by conventional top-down techniques because high-densification of a pattern is possible by self-assembling.

Fourth Example

Next, an explanation will be given of an example in which a pattern substrate was manufactured. First, an example of degrading and eliminating cylindrical microdomains in a high-molecular thin film M and of forming a porous thin film on a surface of a substrate in accordance with the steps shown in FIGS. 8A to 8B will be explained.

In accordance with the procedures of the first example that the weight fraction of the accessory constituent was 20%, a high-molecular thin film M having cylindrical microdomains formed of polymethylmethacrylate and upstanding (arranged in the film thickness direction) relative to the film surface was formed on a substrate. The arrangement of the pattern was set to be same as that of the first example shown in FIG. 9A.

A substrate was chemically patterned at a lattice spacing d twice as much as the natural period do of the block-copolymer compound, the block-copolymer compound was applied on such a substrate so as to obtain a film thickness of 38 nm, and was subjected to thermal annealing, thereby making microphase separation developed. As a result, a structure having cylindrical microdomains 203 formed of polymethylmethacrylate and arranged in a continuous phase 204 formed of polystyrene regularly was obtained (see FIG. 8A).

Next, the microdomains 203 were eliminated by RIE, and a porous thin film D (pattern medium) was obtained (see FIG. 8B). The gas pressure of oxygen, the output, and the etching time were set to 1 Pa, 20 W, and 90 seconds, respectively.

The surface contour of the manufactured porous thin film D was observed through a scanning electron microscope. As a result, it was confirmed that cylindrical microscopical pores H arranged in the film thickness direction were formed across the entire surface of the porous thin film D. The microscopical pores H each had a diameter of approximately 15 nm. Also, the arrangement of the obtained microscopic pores H in the porous thin film D was analyzed in detail, and it was observed that the microscopical pores H had no defect at an area where a surface thereof was chemically patterned at a period d=24 nm, was arranged in one direction and arranged hexagonally.

In contrast, at an area not chemically-patterned, it became clear that the microscopical pores H were arranged hexagonally as viewed in a microscopic manner but an area arranged hexagonally formed a grain as viewed in a macroscopic manner, and large numbers of lattice defects were present in, in particular, the interfacial area of the grain.

A part of the porous thin film D was peeled and removed from the surface of a substrate 201 using a sharp knife, and a step between the surface of the substrate 201 and the surface of the porous thin film D was measured by AFM (Atomic Force Microscope) observation, and a value thereof was approximately 30 nm.

The obtained aspect ratio of the microscopical pore H was 2.0, and it was confirmed that such a value was large which was not able to be obtained from spherical microdomains. Note that the reason why the thickness of the high-molecular thin film M was reduced to 30 nm from 36 nm prior to RIE may be because the continuous phase 204 formed of polystyrene was slightly etched together with the cylindrical microdomains 203 formed of polymethylmethacrylate by RIE.

Next, in accordance with the steps shown in FIGS. 8C and 8D, a pattern was transferred to the substrate 201 using the porous thin film D (pattern medium). That is, by performing etching on the substrate 201 with the porous thin film D being as a mask, the pattern of the porous thin film D was transferred to the substrate 201. A kind of etching was dry etching using a $CF_4$ gas. As a result, it was possible to transfer the shapes of the microscopical pores H in the porous thin film D and the arrangement thereof to the substrate 201.

What is claimed is:

1. A method of manufacturing a high-molecular thin film having a structure, the method comprising:
   a first step of arranging a high-molecular layer on a surface of a substrate, the high-molecular layer containing a block-copolymer compound; and
   a second step of causing microphase separation of the high-molecular layer and of forming microdomains arranged in a continuous phase regularly, and wherein the block-copolymer compound contains:
      a block copolymer A as a main constituent, the block copolymer A being composed of at least a polymer block chain A1 and a polymer block chain A2; and
      a block copolymer B as an accessory constituent, the block copolymer B being composed of a polymer block chain B1 and a polymer block chain B2, the polymer block chain B1 being miscible with a polymeric phase P1 mainly composed of the polymer block chain A1, and the polymer block chain B2 being miscible with a polymeric phase P2 mainly composed of the polymer block chain A2,
   a molecular weight Mn(A1) of the polymer block chain A1, a molecular weight Mn(A2) of the polymer block chain A2, and a molecular weight Mn(B2) of the polymer block chain B2 satisfy a following relational expression (1):

$$\text{Mn}(A2) > \text{Mn}(A1) \text{ and } \text{Mn}(B2) > \text{Mn}(A2), \quad \text{relational expression (1):}$$

wherein the surface of the substrate has a surface part formed of a first material and a surface part on which a pattern member formed of a second material is arranged discretely to the surface part, and
   in the second step, interfacial tension of the polymeric phase P1 to the surface part formed of the first material is smaller than interfacial tension to the surface part formed of the second material, and interfacial tension of the polymeric phase P2 to the surface part formed of the first material is larger than interfacial tension to the surface part formed of the second material.

2. The manufacturing method according to claim 1, wherein a mass fraction of the block copolymer A relative to a whole composition is greater than or equal to 75% and is less than or equal to 95%.

3. The manufacturing method according to claim 1, wherein the polymer block chain A1 and the polymer block chain B1 have a same chemical structure, and the polymer block chain A2 and the polymer block chain B2 have a same chemical structure.

4. The manufacturing method according to claim 1, wherein a ratio between a density of the microdomains and a density of the pattern member is n:1, where n is a number larger than 1.

5. The manufacturing method according to claim 1, wherein the pattern member is arranged regularly.

6. The manufacturing method according to claim 1, wherein the pattern member is arranged on the surface of the substrate at an average period, and the average period is larger than a natural period of the microdomain by what corresponds to a natural integer.

7. The manufacturing method according to claim 1, wherein the microdomain is in a cylindrical shape.

8. The manufacturing method according to claim 1, wherein a thickness t of the high-molecular thin film and the natural period do of the microdomain satisfy a following relational expression (2):

$$(m+0.3) \times do < t < (m+0.7) \times do \quad \text{relational expression (2):}$$

where m is an integer greater than or equal to 0.

9. A method of manufacturing a pattern medium, the method comprising:
   a step of eliminating either a continuous phase of the high-molecular thin film or microdomains thereof, the high-molecular thin film being obtained on a substrate by the manufacturing method comprising:
   a first step of arranging a high-molecular layer on a surface of a substrate, the high-molecular layer containing a block-copolymer compound; and
   a second step of causing microphase separation of the high-molecular layer and of forming microdomains arranged in a continuous phase regularly, and wherein the block-copolymer compound contains:
      a block copolymer A as a main constituent, the block copolymer A being composed of at least a polymer block chain A1 and a polymer block chain A2; and
      a block copolymer B as an accessory constituent, the block copolymer B being composed of a polymer block chain B1 and a polymer block chain B2, the polymer block chain B1 being miscible with a polymeric phase P1 mainly composed of the polymer block chain A1, and the polymer block chain B2 being miscible with a polymeric phase P2 mainly composed of the polymer block chain A2,
   a molecular weight Mn(A1) of the polymer block chain A1, a molecular weight Mn(A2) of the polymer block chain A2, and a molecular weight Mn(B2) of the polymer block chain B2 satisfy a following relational expression (1):

$$\text{Mn}(A2) > \text{Mn}(A1) \text{ and } \text{Mn}(B2) > \text{Mn}(A2), \quad \text{relational expression (1):}$$

wherein the surface of the substrate has a surface part formed of a first material and a surface part on which a pattern member formed of a second material is arranged discretely to the surface part, and in the second step, interfacial tension of the polymeric phase P1 to the surface part formed of the first material is smaller than interfacial tension to the surface part formed of the second material, and interfacial tension of the polymeric phase P2 to the surface part formed of the first material is larger than interfacial tension to the surface part formed of the second material.

10. The pattern-medium manufacturing method according to claim 9, further comprising a step of, after either the continuous phase or the microdomains are eliminated, performing etching on the substrate with remaining either the continuous phase or the microdomains being as a mask.

* * * * *